United States Patent
Hatano

(10) Patent No.: US 11,239,817 B2
(45) Date of Patent: Feb. 1, 2022

(54) LOW LOSS TEMPERATURE COMPENSATED SURFACE ACOUSTIC WAVE FILTER AND DUPLEXER

(71) Applicant: SKYWORKS SOLUTIONS, INC., Irvine, CA (US)

(72) Inventor: Koichi Hatano, Yokohama (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 21 days.

(21) Appl. No.: 16/918,050

(22) Filed: Jul. 1, 2020

(65) Prior Publication Data
US 2021/0006225 A1    Jan. 7, 2021

Related U.S. Application Data

(60) Provisional application No. 62/869,630, filed on Jul. 2, 2019.

(51) Int. Cl.
| | |
|---|---|
| *H03H 9/02* | (2006.01) |
| *H03H 9/145* | (2006.01) |
| *H03H 9/25* | (2006.01) |
| *H03H 9/72* | (2006.01) |
| *H03H 9/64* | (2006.01) |

(52) U.S. Cl.
CPC .... *H03H 9/02834* (2013.01); *H03H 9/02858* (2013.01); *H03H 9/02881* (2013.01); *H03H 9/1452* (2013.01); *H03H 9/14541* (2013.01); *H03H 9/25* (2013.01); *H03H 9/6406* (2013.01); *H03H 9/6436* (2013.01); *H03H 9/725* (2013.01)

(58) Field of Classification Search
CPC ...... H03H 9/02834; H03H 9/25; H03H 9/725; H03H 9/6406; H03H 9/14541; H03H 9/6436; H03H 9/02858; H03H 9/02881; H03H 9/1452
USPC .......................................... 333/133, 193–196
See application file for complete search history.

(56) References Cited

U.S. PATENT DOCUMENTS

| | | | |
|---|---|---|---|
| 9,640,750 B2* | 5/2017 | Nakanishi | H03H 9/02858 |
| 10,361,678 B2* | 7/2019 | Iwaki | H03H 9/6489 |
| 2014/0285287 A1* | 9/2014 | Komatsu | H03H 9/02858 |
| | | | 333/195 |

* cited by examiner

*Primary Examiner* — Robert J Pascal
*Assistant Examiner* — Jorge L Salazar, Jr.
(74) *Attorney, Agent, or Firm* — Lando & Anastasi, LLP

(57) ABSTRACT

A surface acoustic wave resonator comprises at least one set of interdigital transducer (IDT) electrodes disposed on an upper surface of a piezoelectric substrate between first and second reflector gratings, a layer of silicon nitride disposed over the at least one set of IDT electrodes and the first and second reflector gratings, and a continuous trench formed in the layer of silicon nitride over portions of bus bar electrodes and tips of electrode fingers of the at least one set of IDT electrodes and over portions of bus bar electrodes and electrode fingers of the first and second reflector gratings to reduce acoustic leakage at electrode fingers of the first and second reflector gratings proximate the at least one set of IDT electrodes.

15 Claims, 21 Drawing Sheets

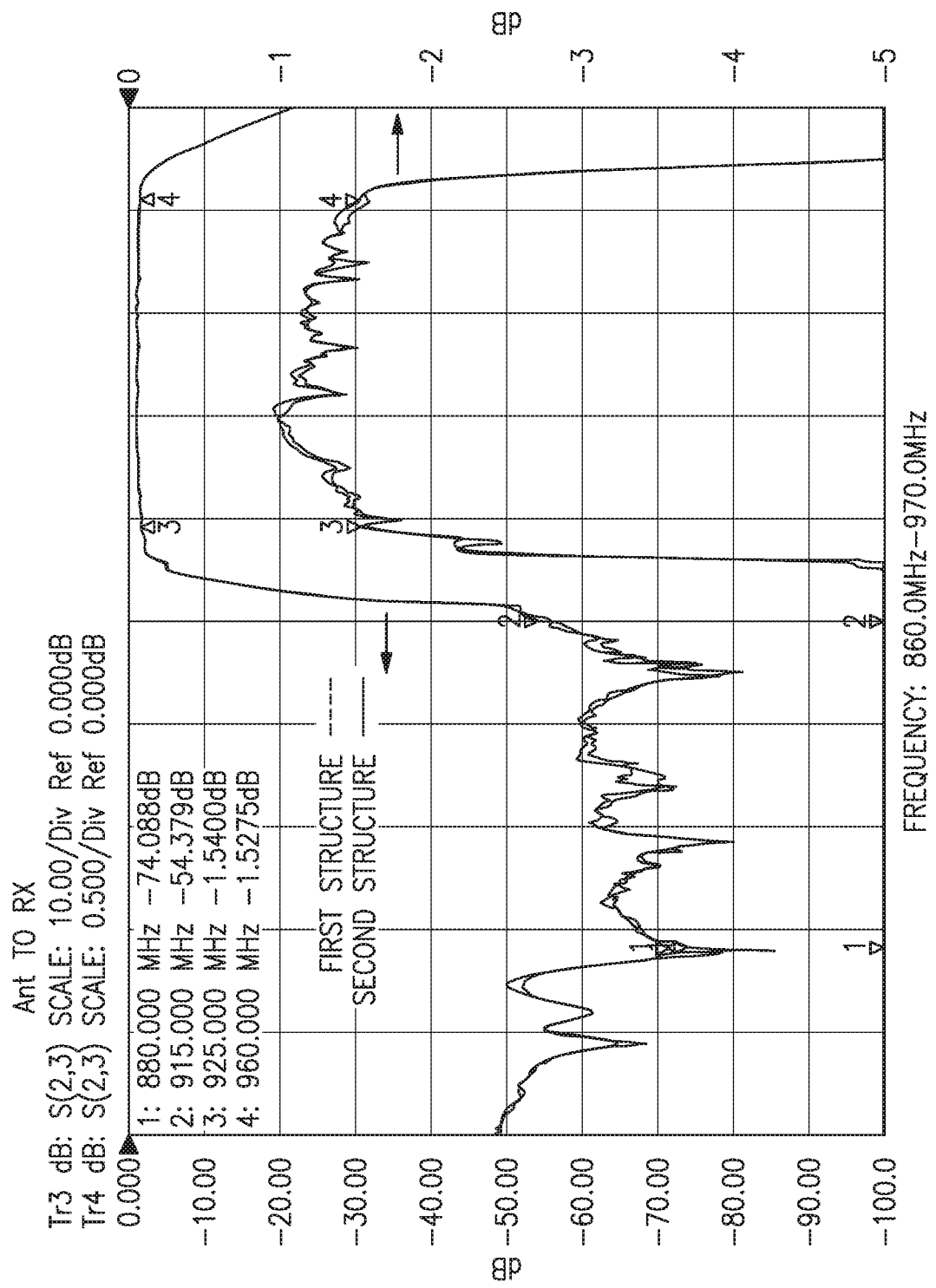

LOW LOSS TEMPERATURE COMPENSATED SURFACE ACOUSTIC WAVE FILTER AND DUPLEXER

CROSS-REFERENCE TO RELATED APPLICATIONS

This application claims priority under 35 U.S.C. § 119(e) to U.S. Provisional Patent Application Ser. No. 62/869,630, titled LOW LOSS TEMPERATURE COMPENSATED SURFACE ACOUSTIC WAVE FILTER AND DUPLEXER, filed Jul. 2, 2019, which is incorporated herein by reference in its entirety.

BACKGROUND

Technical Field

Embodiments of this disclosure relate to acoustic wave devices and to suppression of spurious signals in same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with one aspect, there is provided a surface acoustic wave (SAW) resonator. The SAW resonator comprises at least one set of interdigital transducer (IDT) electrodes disposed on an upper surface of a piezoelectric substrate between first and second reflector gratings, a layer of silicon nitride disposed over the at least one set of IDT electrodes and the first and second reflector gratings, and a continuous trench formed in the layer of silicon nitride over portions of bus bar electrodes and tips of electrode fingers of the at least one set of IDT electrodes and over portions of bus bar electrodes and electrode fingers of the first and second reflector gratings to reduce acoustic leakage at electrode fingers of the first and second reflector gratings proximate the at least one set of IDT electrodes.

In some embodiments, the first and second reflector gratings each include reduced length electrode fingers with lengths less than a length between the bus bar electrodes of the first and second reflector gratings and full-length electrode fingers extending between the bus bar electrodes of the first and second reflector gratings. The reduced length electrode fingers may be positioned on sides of the first and second reflector gratings closest to the at least one set of IDT electrodes. The reduced length electrode fingers closest to the at least one set of IDT electrodes may include tip portions spaced from one of the bus bar electrodes of the first and second reflector gratings on an opposite side of the resonator than tip portions of outermost electrode fingers of the at least one set of IDT electrodes. The reduced length electrode fingers may include about 25% of a total number of electrode fingers in the reflector gratings.

In some embodiments, the SAW resonator further comprises a layer of silicon oxynitride disposed on an upper surface of the layer of silicon nitride.

In some embodiments, the SAW resonator is configured as a single port resonator.

In some embodiments, the SAW resonator is configured as a longitudinal mode coupled resonator.

In some embodiments, each set of IDT electrodes includes electrodes with varying pitches.

In some embodiments, each of the reflector gratings includes electrodes with varying pitches.

In some embodiments, no electrode fingers in the at least one set of IDT electrodes are apodized.

In some embodiments, the trench extends beyond outer sides of the first and second reflector gratings on opposite sides of the first and second reflector gratings from the at least one set of IDT electrodes.

In accordance with another aspect, there is provided a radio frequency filter including at least one surface acoustic wave (SAW) resonator. The at least one SAW resonator comprises at least one set of interdigital transducer (IDT) electrodes disposed on an upper surface of a piezoelectric substrate between first and second reflector gratings, a layer of silicon nitride disposed over the at least one set of IDT electrodes and first and second reflector gratings, and a continuous trench formed in the layer of silicon nitride over portions of bus bar electrodes and tips of electrode fingers of the at least one set of IDT electrodes and over portions of bus bar electrodes and electrode fingers of the first and second reflector gratings.

In accordance with another aspect, there is provided an electronics module having at least one radio frequency filter including at least one surface acoustic wave (SAW) resonator. The at least one SAW resonator comprises at least one set of interdigital transducer (IDT) electrodes disposed on an upper surface of a piezoelectric substrate between first and second reflector gratings, a layer of silicon nitride disposed over the at least one set of IDT electrodes and first and second reflector gratings, and a continuous trench formed in the layer of silicon nitride over portions of bus bar electrodes and tips of electrode fingers of the at least one set of IDT electrodes and over portions of bus bar electrodes and electrode fingers of the first and second reflector gratings to reduce acoustic leakage at electrode fingers of the first and second reflector gratings proximate the at least one set of IDT electrodes.

In accordance with another aspect, there is provided an electronic device with an electronics module having at least one radio frequency filter including at least one surface acoustic wave (SAW) resonator. The at least one SAW resonator comprises at least one set of interdigital transducer (IDT) electrodes disposed on an upper surface of a piezoelectric substrate between first and second reflector gratings, a layer of silicon nitride disposed over the at least one set of IDT electrodes and first and second reflector gratings, and a continuous trench formed in the layer of silicon nitride over portions of bus bar electrodes and tips of electrode fingers of the at least one set of IDT electrodes and over portions of bus bar electrodes and electrode fingers of the first and second reflector gratings to reduce acoustic leakage at electrode fingers of the first and second reflector gratings proximate the at least one set of IDT electrodes.

In accordance with another aspect, there is provided a surface acoustic wave (SAW) resonator. The SAW resonator comprises at least one set of interdigital transducer (IDT) electrodes disposed on an upper surface of a piezoelectric substrate between first and second reflector gratings, the first and second reflector gratings each including reduced length electrode fingers with lengths less than a length between bus bar electrodes of the first and second reflector gratings, a layer of silicon nitride disposed over the at least one set of IDT electrodes and first and second reflector gratings, and a trench formed in the layer of silicon nitride over portions of bus bar electrodes and tips of electrode fingers of the at least one set of IDT electrodes and over portions of the bus bar electrodes and electrode fingers of the first and second reflector gratings to reduce acoustic leakage at electrode fingers of the first and second reflector gratings proximate the at least one set of IDT electrodes.

In some embodiments, the reduced length electrode fingers are positioned on sides of the first and second reflector gratings closest to the at least one set of IDT electrodes.

BRIEF DESCRIPTION OF THE DRAWINGS

Embodiments of this disclosure will now be described, by way of non-limiting example, with reference to the accompanying drawings.

FIG. 7C is a chart comparing insertion loss of a receive side filter of the duplexer of FIG. 7A with different resonator types as disclosed herein;

DETAILED DESCRIPTION OF CERTAIN EMBODIMENTS

Figure 1A:
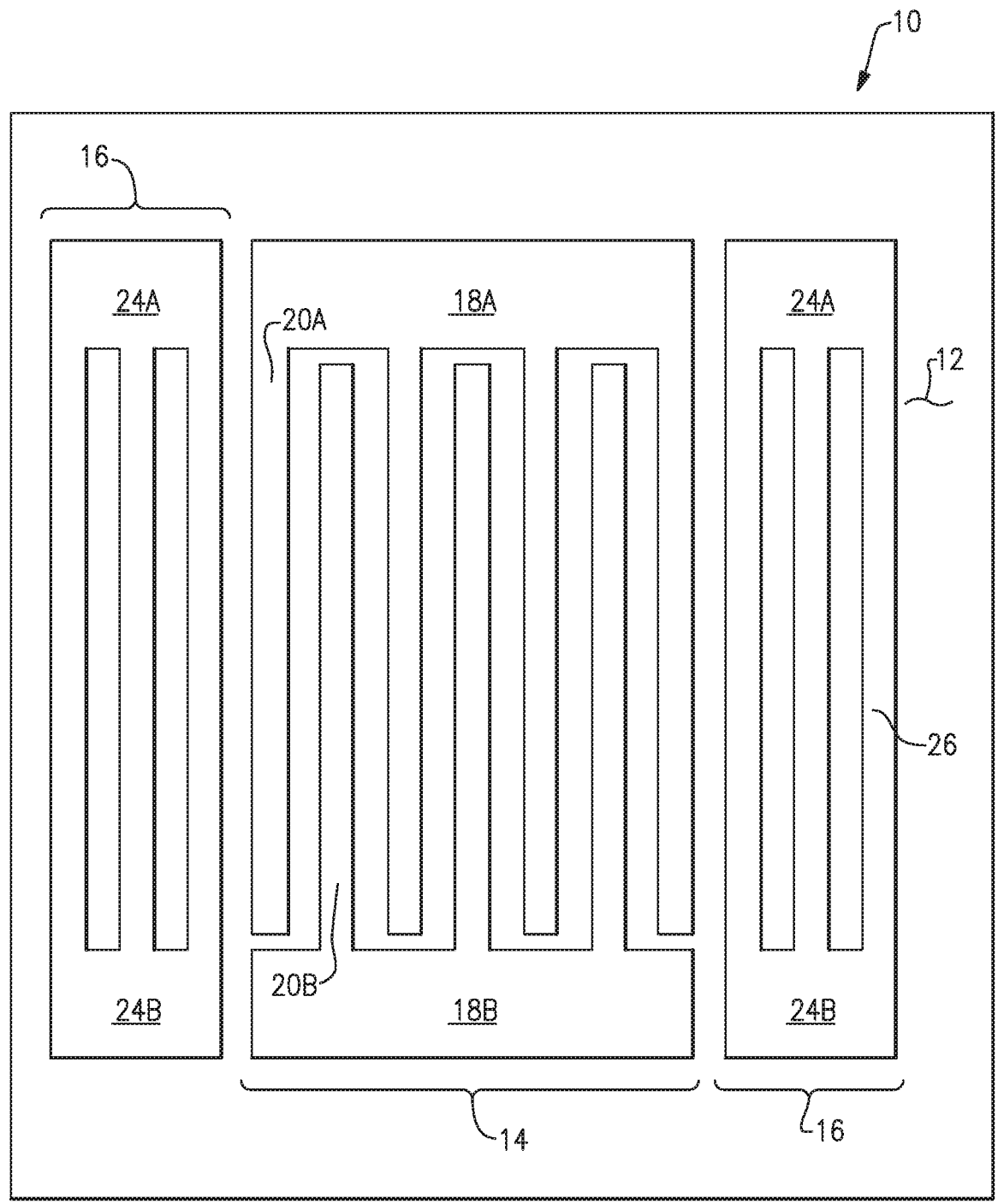
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate ($LiTaO_3$) or lithium niobate ($LiNbO_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
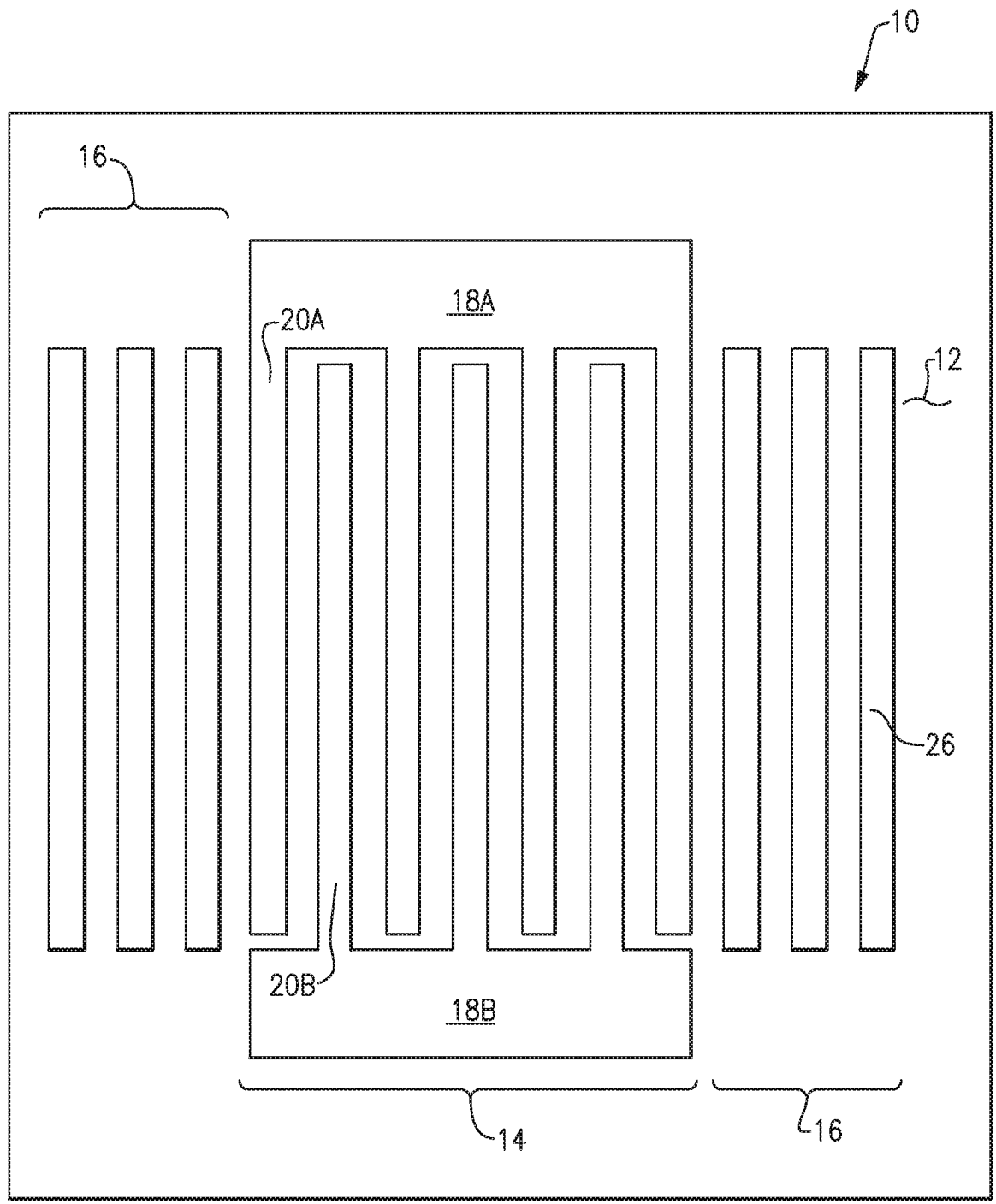
FIG. 1B is a simplified plan view of another example of a surface acoustic wave resonator.
Figure 1C:
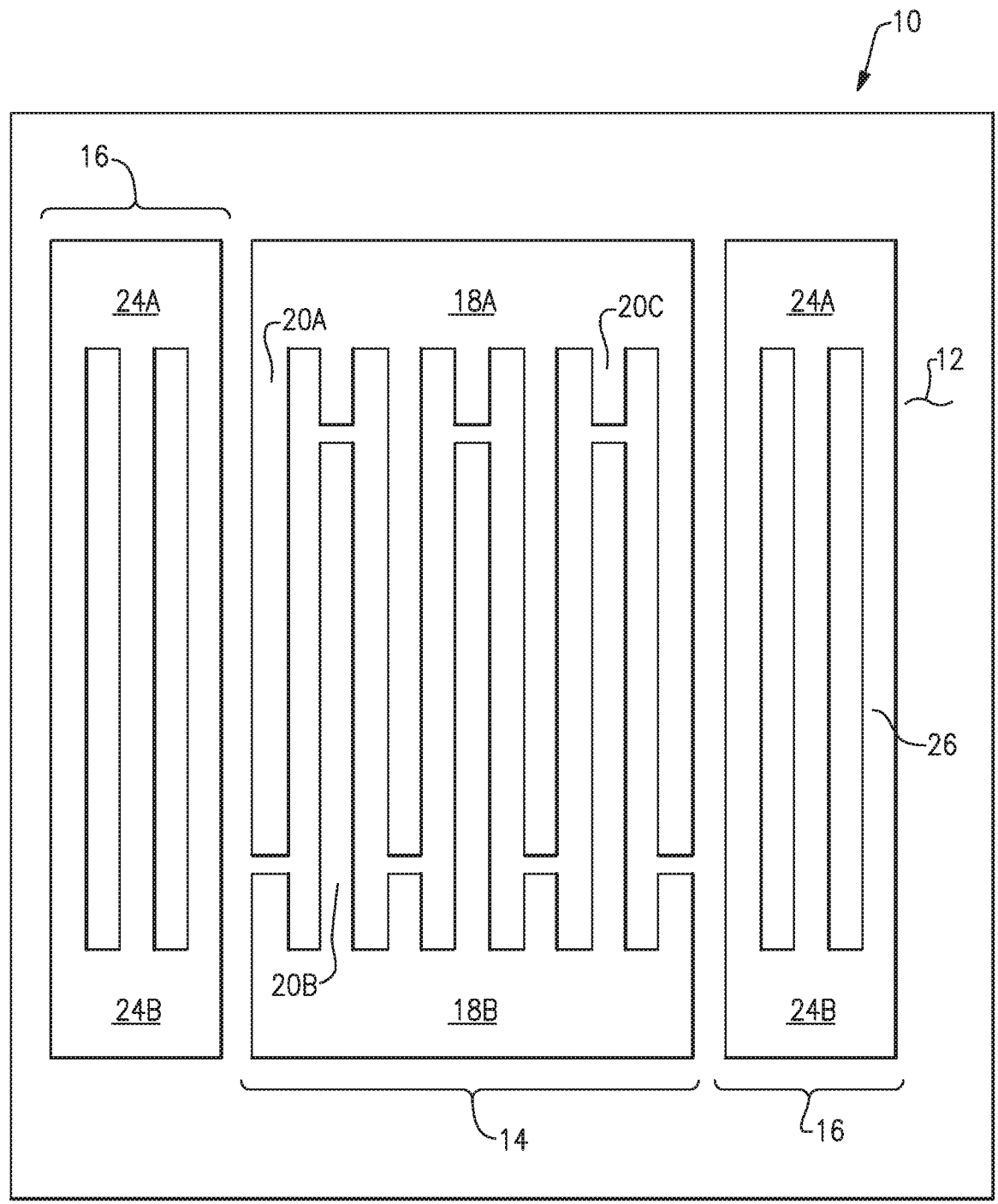
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, is are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2A:
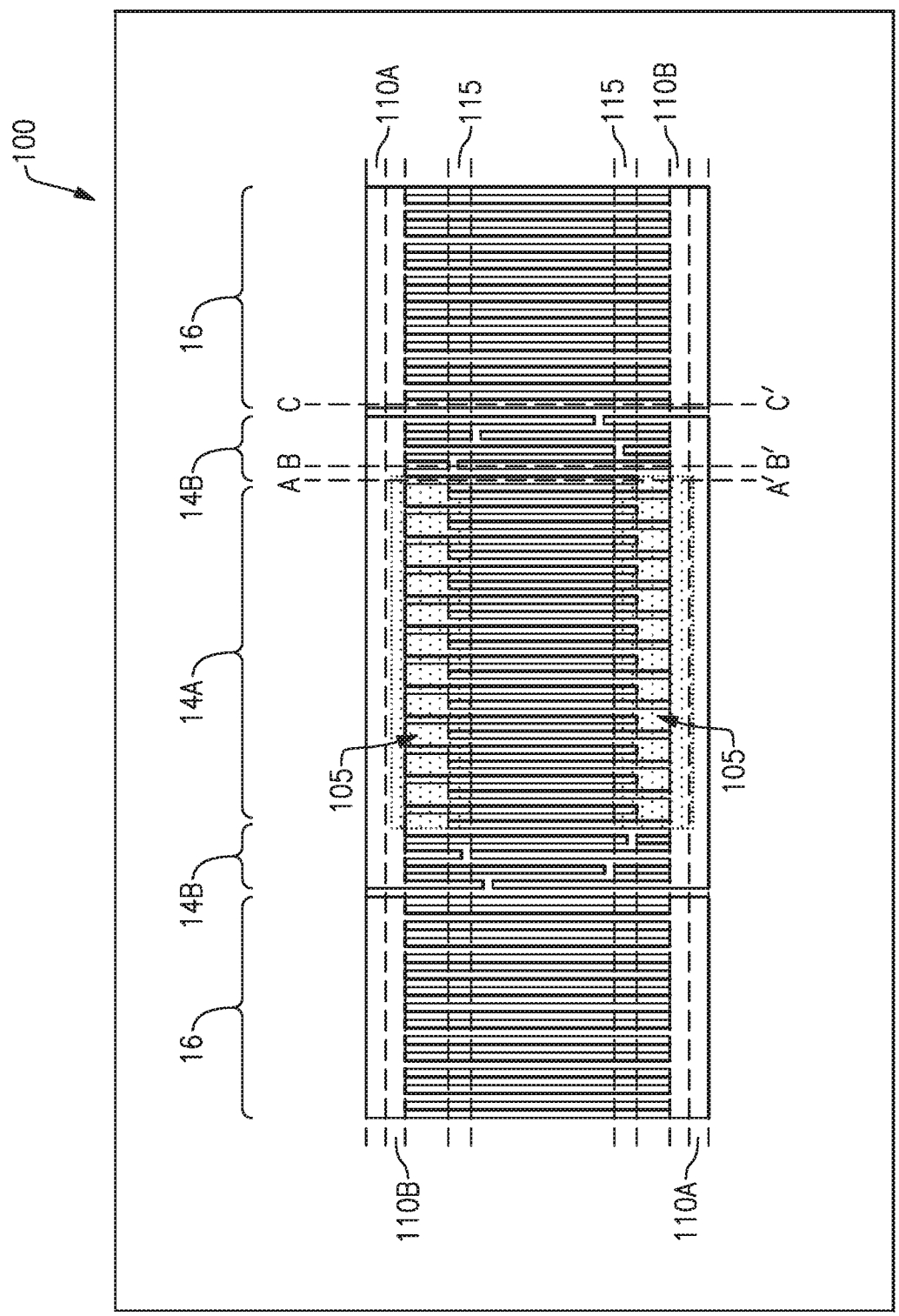
FIG. 2A illustrates an example of a surface acoustic wave resonator including a silicon nitride trench structure in plan view.
Figure 2B:
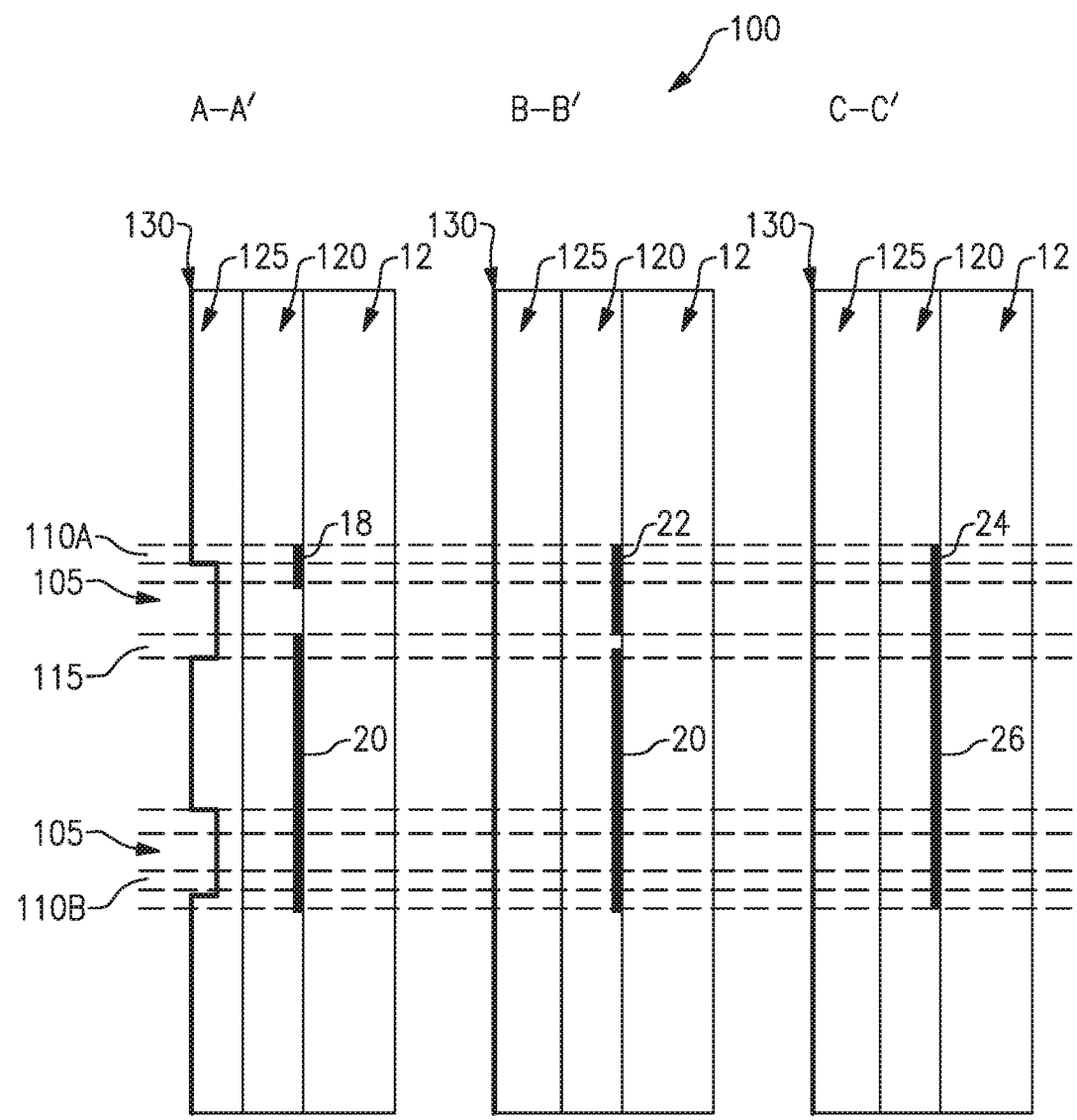
FIG. 2B illustrates cross-sections through different portions of the surface acoustic wave resonator of FIG. 2A.

FIG. 2A illustrates another example of a SAW resonator 100 in plan view. SAW resonator 100 is a one port resonator (also referred to as a single port resonator herein). Cross-sectional views through lines A-A', B-B', and C-C' of the SAW resonator 100 of FIG. 2A are illustrated in FIG. 2B. The SAW resonator 100 includes an IDT electrode section having a central part 14A in which the IDT electrodes are each the same size and apodization parts 14B in which the electrode fingers 20 (labelled in FIG. 2B) decrease in length with proximity to the outer sides of the apodization parts, and which includes dummy electrode fingers 22 (labelled in FIG. 2B) extending from the opposite bus bar from each of the electrode fingers. The dummy electrode fingers are the shorter of the electrode fingers in the apodization parts 14B. The SAW resonator 100 includes silicon nitride ($Si_3N_4$, also abbreviated as "SiN" herein) trench structures 105 in which a trench is formed in a SiN layer of the SAW resonator 100, as better illustrated in FIG. 2B. The SiN trench structures 105 may extend over tips of the IDT electrode fingers 20 by about 1λ (the width of region 115 in FIG. 2A) and may have a depth that sets the difference in acoustic wave velocity between the center region of the IDT electrodes not covered by the SiN trench structure and the tips of the IDT electrodes covered by the SiN trench structure by about 50 m/s. The SAW resonator 100 includes outer bus bar regions 110A including the bus bars but not including the SiN trench structures 105, inner bus bar regions 110B including the bus bars and the SiN trench structures, and trenched electrode regions 115 including the IDT electrodes and the SiN trench structures 105. The SiN trench structures are only present in the central part 14A of the SAW resonator 1100. The IDT electrode section is sandwiched between reflectors 16.

Figure 2C:
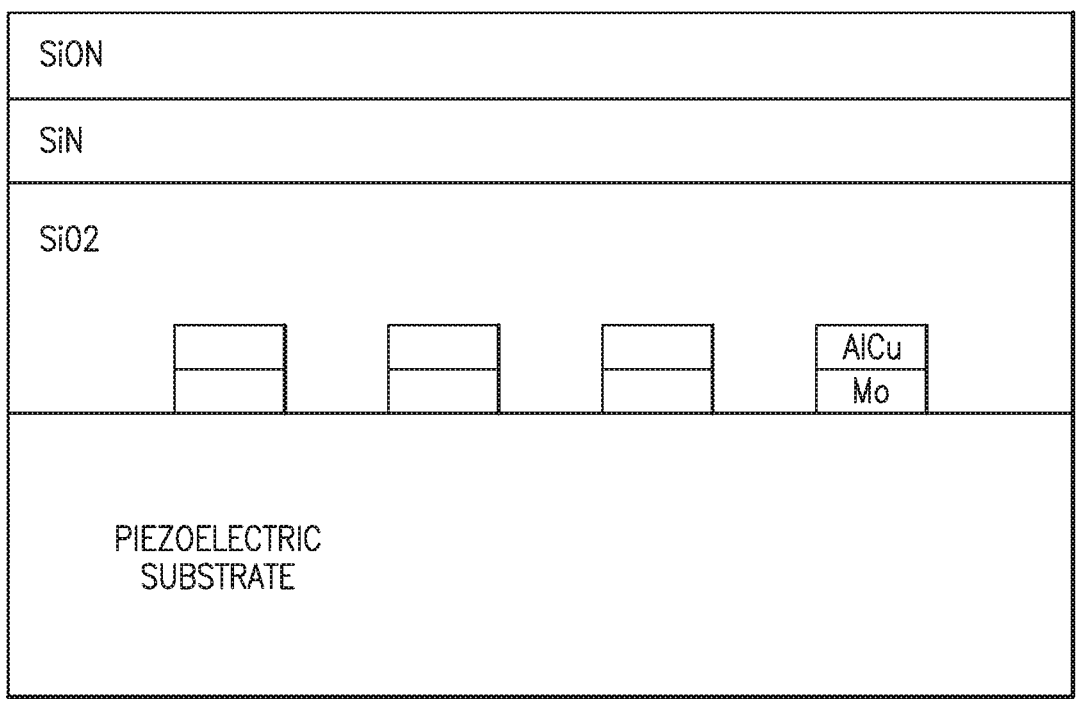
FIG. 2C illustrates a cross-section of a portion of the surface acoustic wave resonator of FIG. 2A.

Referring to FIGS. 2B and 2C the SAW resonator 100 includes a layered structure having a piezoelectric substrate 12, a layer of silicon dioxide ($SiO_2$) 120 disposed on top of the piezoelectric substrate 12 and over the IDT electrodes 20, 22 and reflector electrodes 26, a layer of SiN 125 disposed on top of the $SiO_2$ layer 120, and, optionally, a layer of silicon oxynitride (SiON) 130 disposed on top of the SiN layer 125. The $SiO_2$ layer 120 may have a negative temperature coefficient of frequency, which helps to offset the positive temperature coefficient of frequency of the piezoelectric substrate 12 and reduce the change in frequency response of the SAW device with changes in temperature. A SAW device with a layer of $SiO_2$ over the piezoelectric substrate and IDT electrodes may thus be referred to as a temperature-compensated SAW device, or TCSAW. The SiN layer 125 exhibits a higher acoustic velocity than the $SiO_2$ layer 120. The SiN layer 125, in conjunction with the SiN trench structures 105, may help to contain acoustic energy within the SAW resonator 100 due to the discontinuity in acoustic velocity between the inner portion of the IDT electrode region of the SAW resonator including the SiN layer and the SiN trench regions 105 bordering the inner portion of the IDT electrode region. The SiON layer may have an acoustic velocity between the acoustic velocities of the $SiO_2$ layer 120 and SiN layer 125.

As also illustrated in FIG. 2C, the IDT electrodes and reflector electrodes may be layered electrodes including an upper layer of a highly conductive but low-density material, for example, an aluminum-copper alloy (AlCu), and a lower layer of a less conductive, but more dense material, for example, molybdenum (Mo) or tungsten (W). The denser lower layer may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer may have a higher conductivity than the lower layer to provide the electrodes with lower overall resistivity than if they were formed entirely of the denser material.

Figure 2D:
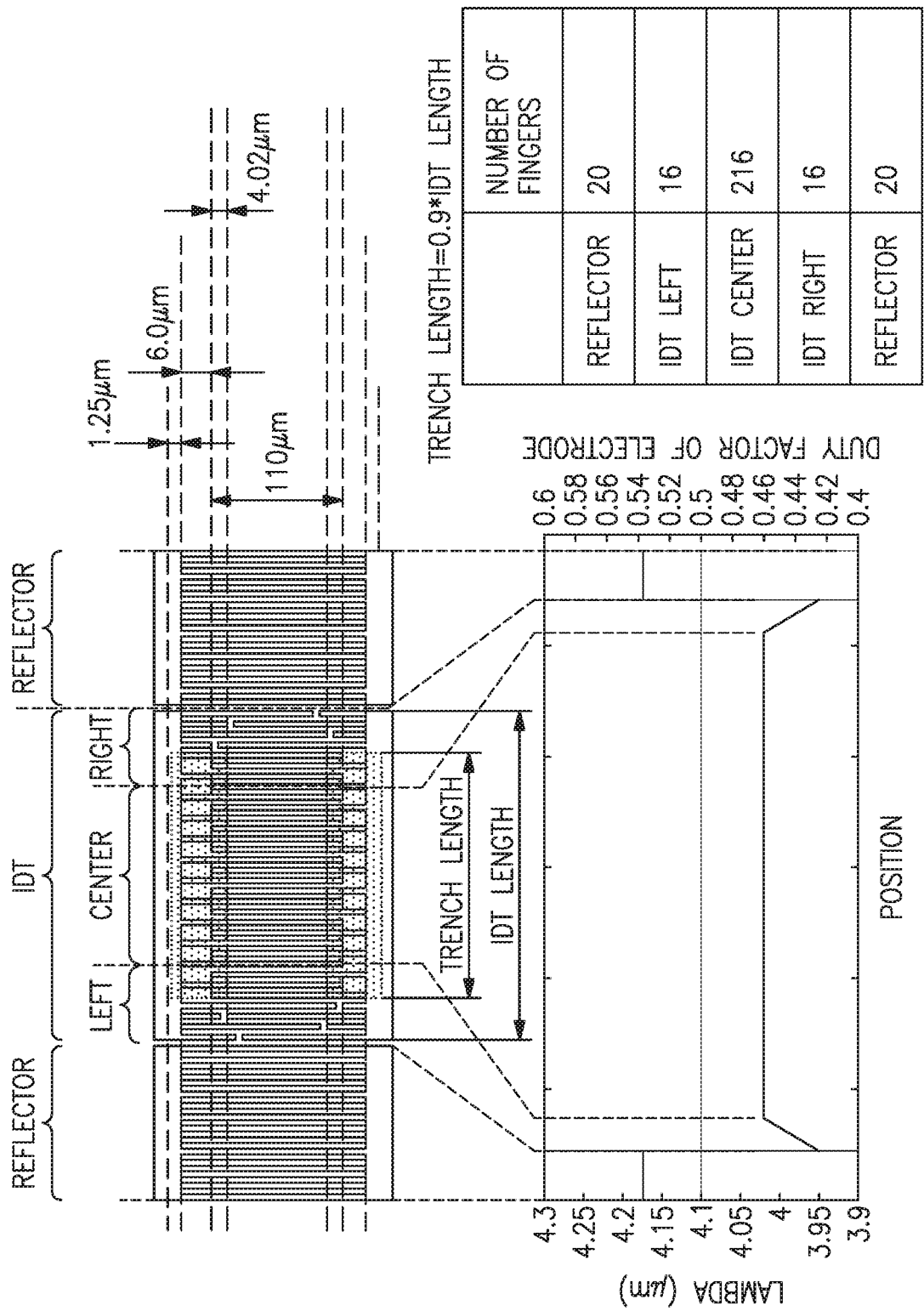
FIG. 2D illustrates further dimensional parameters of features of the surface acoustic wave resonator of FIG. 2A.

FIG. 2D provides examples of thicknesses, numbers of electrodes, and electrode pitch (the length between an edge of a first electrode finger and the corresponding edge of the second electrode finger away from the first electrode finger attached to the same bus bar, referred to as lambda in FIG. 2D) of the different portions of the SAW resonator 100. The SiN trench 105 may overlap the bus bar electrodes by about 1.25 μm. The IDT electrodes may terminate and leave about 6 μm of space between their tips and the bus bars. The SiN trench 105 may overlap the tips of the IDT electrodes by about 4.02 μm. Adjacent IDT electrodes may be interleaved by about 110 μm along their lengths. There may be about 20 fingers in each reflector, about 216 electrode fingers in the center IDT region, and about 16 electrode fingers in each apodized region. The length of the SiN trench may be about 0.9 times the length of the IDT electrode structure. The duty factors of the IDT electrode fingers and reflector fingers may each be 0.5 or about 0.5.

It is to be understood that the dimensions and numbers of electrode fingers described above are only examples and different examples of SAW resonators may have one or more features having different dimensions or numbers of electrode fingers in different regions than those described above or in the other examples provided below.

It is believed that a SAW resonator configured as illustrated in FIGS. 2A and 2B may not have as high a quality factor Q as possible due to the presence of paths for leakage of acoustic energy out of the resonator structure. The apodization parts 14B of the IDT electrode section and the reflectors 16 may leak acoustic energy in the lengthwise direction of the IDT electrode and reflector fingers because there is no structure, such as a SiN trench, providing an acoustic velocity discontinuity bounding these regions. A wave that propagates from the IDT electrodes to the reflectors may be partially emitted as a bulk wave emission from the boundary portions between the IDT electrodes and the reflectors because the apodization parts 14B of the IDT electrodes have short electrode fingers that cause discontinuity in the structures between the IDT electrodes and the reflector electrodes.

Figure 3A:
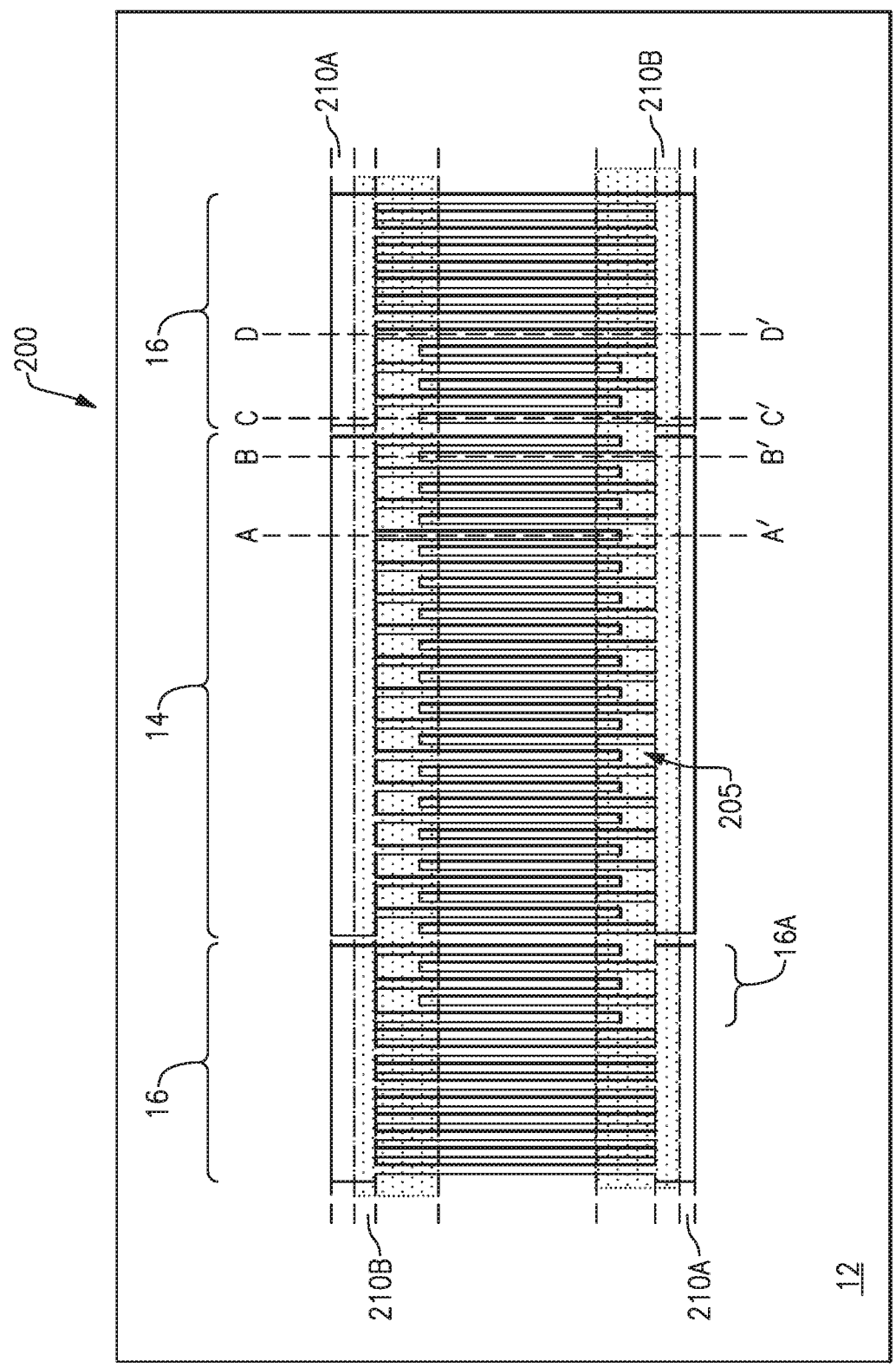
FIG. 3A illustrates another example of a surface acoustic wave resonator including a silicon nitride trench structure in plan view.
Figure 3B:
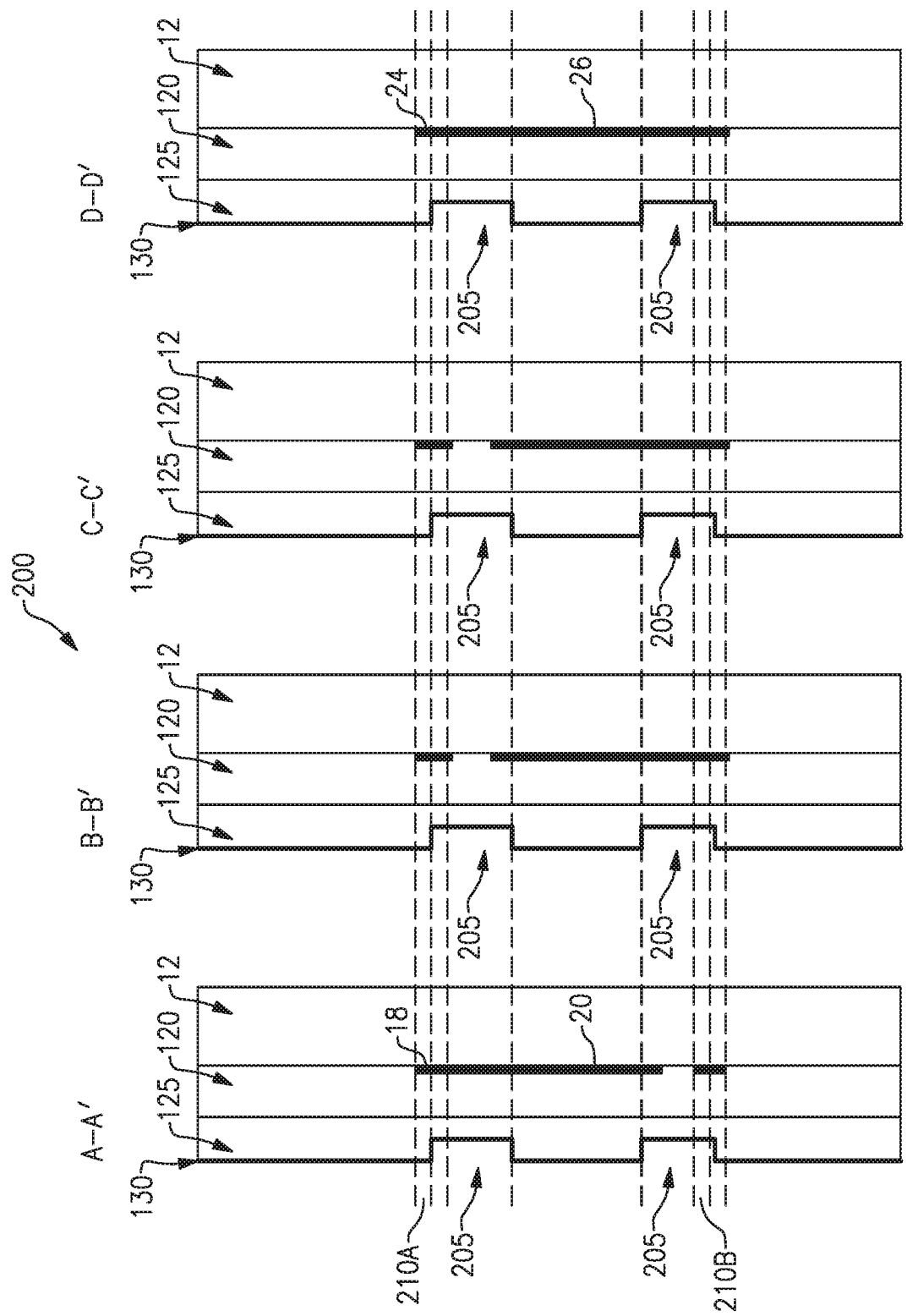
FIG. 3B illustrates cross-sections through different portions of the surface acoustic wave resonator of FIG. 3A.

An alternate one port SAW resonator structure 300 is illustrated in plan and cross-sectional views through lines A-A', B-B', C-C', and D-D' in FIGS. 3A and 3B, respectively. A difference between the SAW resonator 200 and the SAW resonator 100 is that in the SAW resonator 200, the apodization parts 14B of the IDT electrodes of the SAW resonator 100 have been eliminated. All IDT electrode fingers in the SAW resonator 200 have the same length. In the SAW resonator 200 all electrode fingers in the reflectors 16 do not have the same length. The reflectors 16 of the SAW resonator 200 include a region 16A with electrode fingers that do not fully extend between the reflector busbars. The electrode fingers in region 16A of the reflectors 16 of SAW resonator 200 may have the same lengths as the lengths of the IDT electrode fingers. The shortened electrode fingers in region 16A of the reflectors 16 of SAW resonator 200 may include up to 25% of the total number of electrode fingers in the reflectors. The innermost shortened electrode fingers in region 16A adjacent to the IDT electrodes 14, for example, the shortened electrode finger through which line C-C' passes in FIG. 3A, include tip portions spaced from the reflector bus bars on an opposite side of the resonator than tip portions of the outermost IDT electrodes 14 adjacent to the innermost shortened electrode fingers that are spaced from the IDT bus bar electrodes. Further, in SAW resonator 200 the SiN trench regions 205 are continuous and extend across an entirety of the IDT electrodes and reflectors and may extend partially beyond the outer edges of the reflectors 16. The SiN trenches 205 cover portions of the busbars, bases, and tips of the IDT electrodes and portions of the busbars and electrode fingers in the reflectors, including tips of the reduced length reflector electrode fingers in region 16A.

The numbers of electrodes, electrode pitch, and thicknesses of the various layers and regions of the SAW resonator 200 may be the same as in the SAW resonator 100 as illustrated in FIGS. 2C and 2D except, as noted above, the SiN trench extends across the entire IDT electrode and reflector structures.

Eliminating the apodized parts of the IDT electrodes in SAW resonator 200 may reduce the leakage of acoustic waves that might otherwise occur from the apodized parts of the IDT electrodes of the SAW resonator 100. In SAW resonator 200, the shortening of the reflector electrode fingers on the IDT electrode sides of the reflectors may both reduce the leakage of acoustic waves in the lengthwise direction of electrode fingers and may reduce the discontinuity of the structures at the boundaries between the IDT electrodes and the reflectors and thus may reduce the bulk wave emission as compared to SAW resonator 100.

Figure 4A:
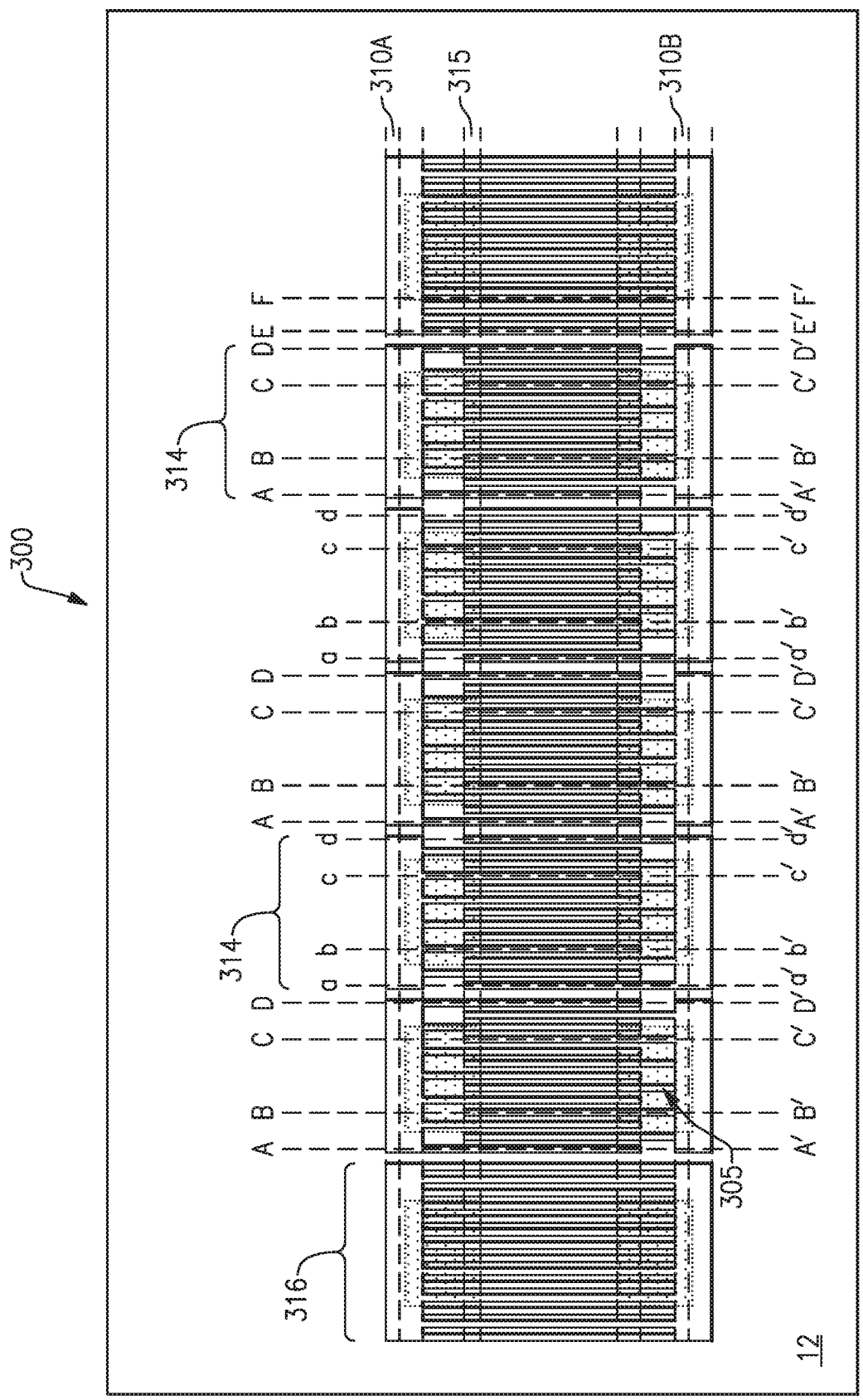
FIG. 4A illustrates an example of a longitudinal mode coupled surface acoustic wave resonator including a silicon nitride trench structure in plan view.
Figure 4B:
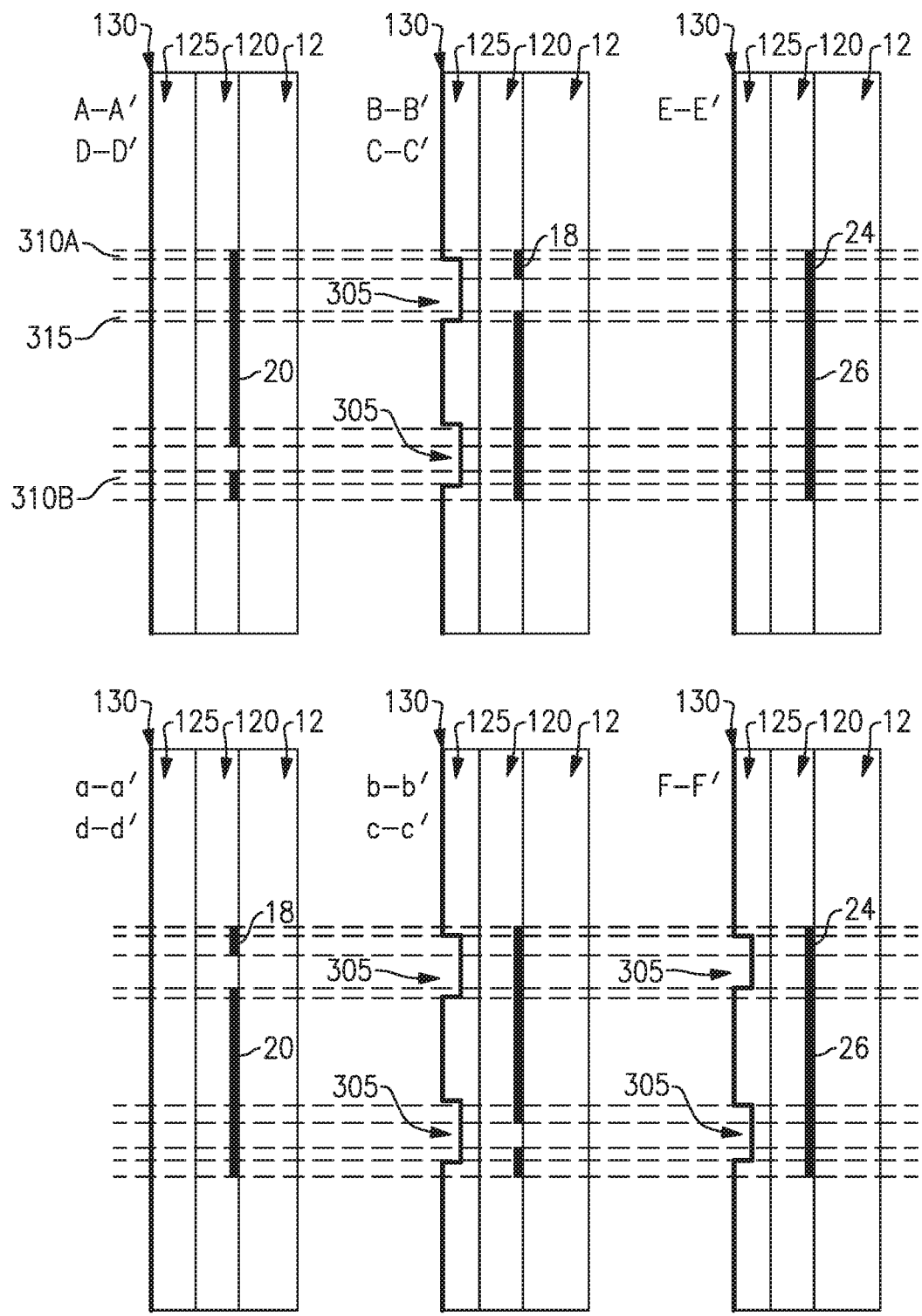
FIG. 4B illustrates cross-sections through different portions of the longitudinal mode coupled surface acoustic wave resonator of FIG. 4A.

An example of a longitudinal mode coupled resonator 300 is illustrated in plan view in FIG. 4A. Cross-sectional views through lines A-A', B-B', C-C', D-D', E-E', F-F', a-a', b-b', c-c', and d-d' of the longitudinal mode coupled resonator 300 of FIG. 4A are illustrated in FIG. 4B. The longitudinal mode coupled resonator 300 includes a plurality of IDT electrode structures 314, five in the example of FIG. 4A, disposed between reflector gratings 316. Each of the IDT electrode structures 314 may be similar to the IDT electrodes 14 illustrated in FIG. 1A. Each of the reflector gratings 316 may be similar to the reflectors 16 of the SAW resonator 100. Each of the IDT electrode structures 314 and reflector gratings 316 include SiN trench structures 305 covering portions of the bus bars and electrode fingers on each bus bar side of the IDT electrode structures 314 and reflector gratings 316. Edge regions of the IDT electrode structures 314 and reflector gratings 316 in a direction perpendicular to the lengthwise extending directions of the IDT electrode fingers and reflector electrode fingers do not include the SiN trench structures. The bus bars of the IDT electrode structures 314 and reflector gratings 316 include regions 310A that do not include the SiN trench structures and regions 310B that do include the SiN trench structures. The SiN trench structures are present in regions 315 including tips of the IDT electrode fingers. As illustrated in the cross-sectional views through lines A-A', B-B', C-C', D-D', E-E', F-F', a-a', b-b', c-c', and d-d' of the longitudinal mode coupled resonator 300 in FIG. 4B, the SiN trench structures 305 are only present in the sections through which lines B-B', C-C', F-F', b-b', and c-c' pass. The longitudinal mode coupled resonator 300 includes a similar layered structure of piezoelectric substrate 12, IDT electrode fingers 20, reflector electrode fingers 26, $SiO_2$ layer 120, SiN layer 125, and optional SiON layer 130 as in the SAW resonator structures discussed above with respect to FIG. 2C.

Figure 4C:
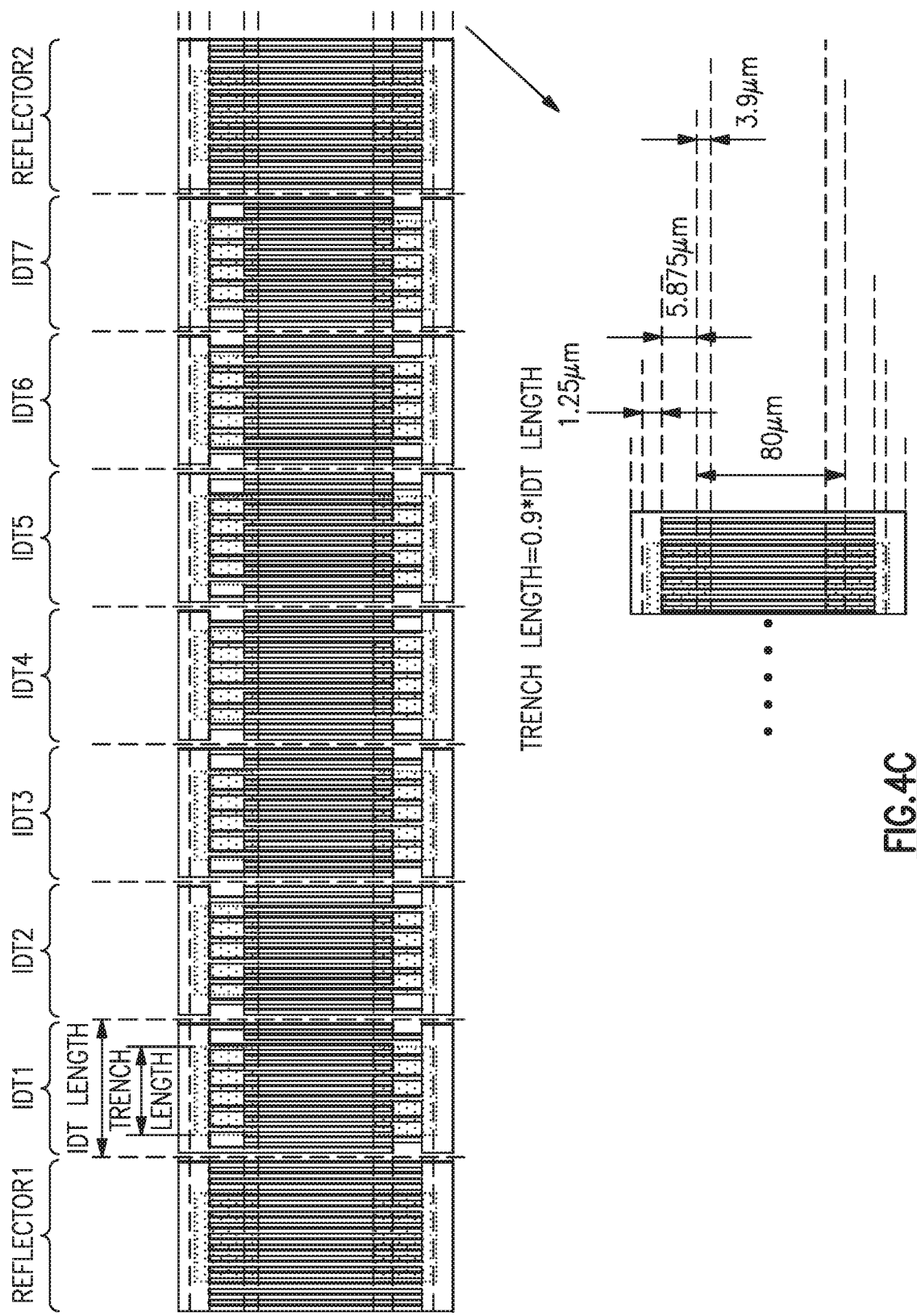
FIG. 4C illustrates another example of a longitudinal mode coupled surface acoustic wave resonator including a silicon nitride trench structure in plan view and dimensional parameters of features of the longitudinal mode coupled surface acoustic wave resonator.

FIG. 4C provides examples of thicknesses of the different portions of a longitudinal mode coupled resonator similar to that of longitudinal mode coupled resonator 300 but including seven IDT electrode structures 314 disposed between the reflector gratings 316 instead of five. The SiN trench 305 may overlap the bus bar electrodes by about 1.25 µm. The IDT electrodes may terminate and leave about 5.875 µm of space between their tips and the bus bars. The SiN trench 105 may overlap the tips of the IDT electrodes by about 3.9 µm. Adjacent IDT electrodes may be interleaved by about 80 µm along their lengths. The length of the SiN trench may be about 0.9 times the length of the IDT electrode structure. The duty factors of the IDT electrode fingers and reflector fingers are each 0.5.

It is believed that a longitudinal mode coupled resonator configured as illustrated in FIGS. 4A-4C may not have as high a quality factor Q as possible due to the presence of paths for leakage of acoustic energy out of the resonator structure. At the outermost electrodes of the IDT electrode structures and the reflectors, energy may leak out of the resonator in a direction parallel to the lengthwise extension direction of the IDT and reflector electrodes because no sound velocity difference is provided by the SiN trench structure in these area. At the boundary between the outermost IDT electrode structures and the reflectors, an acoustic wave that propagates from the IDT electrode structures to the reflectors may be emitted as bulk wave emission because the IDT electrodes have short electrode fingers that cause discontinuity in the structures between the IDT electrodes and the reflector electrodes.

Figure 5A:
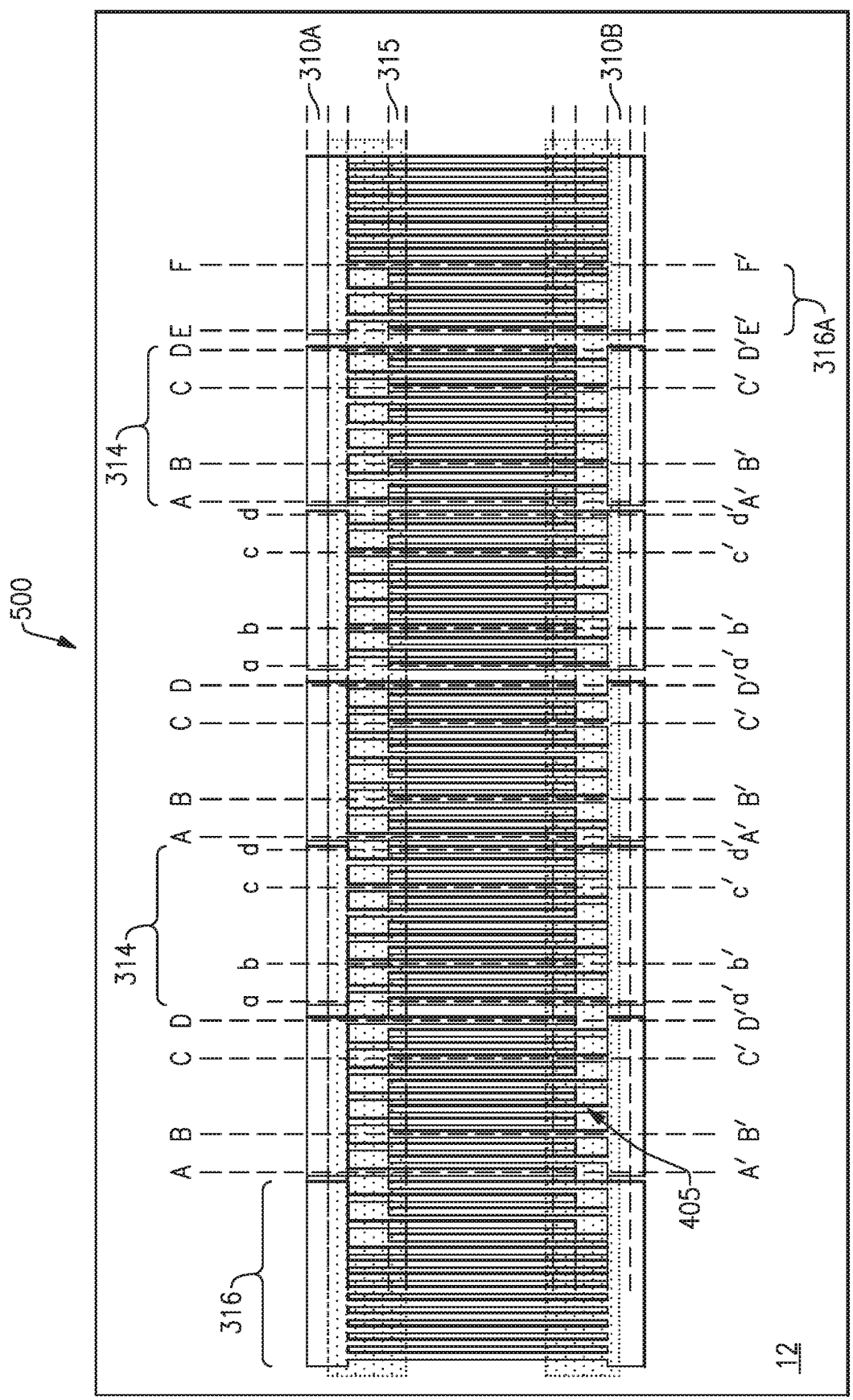
FIG. 5A illustrates another example of a longitudinal mode coupled surface acoustic wave resonator including a silicon nitride trench structure in plan view.
Figure 5B:
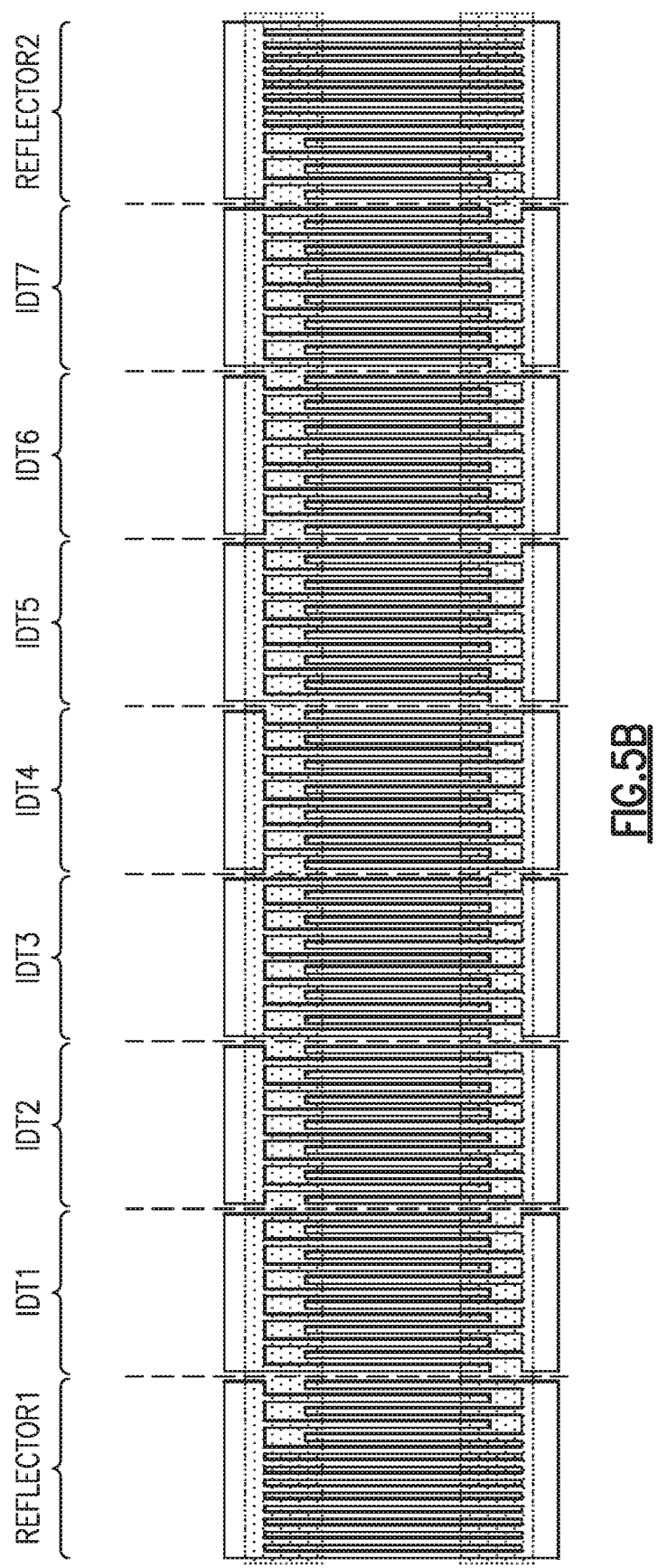
FIG. 5B illustrates another example of a longitudinal mode coupled surface acoustic wave resonator including a silicon nitride trench structure in plan view.
Figure 5C:
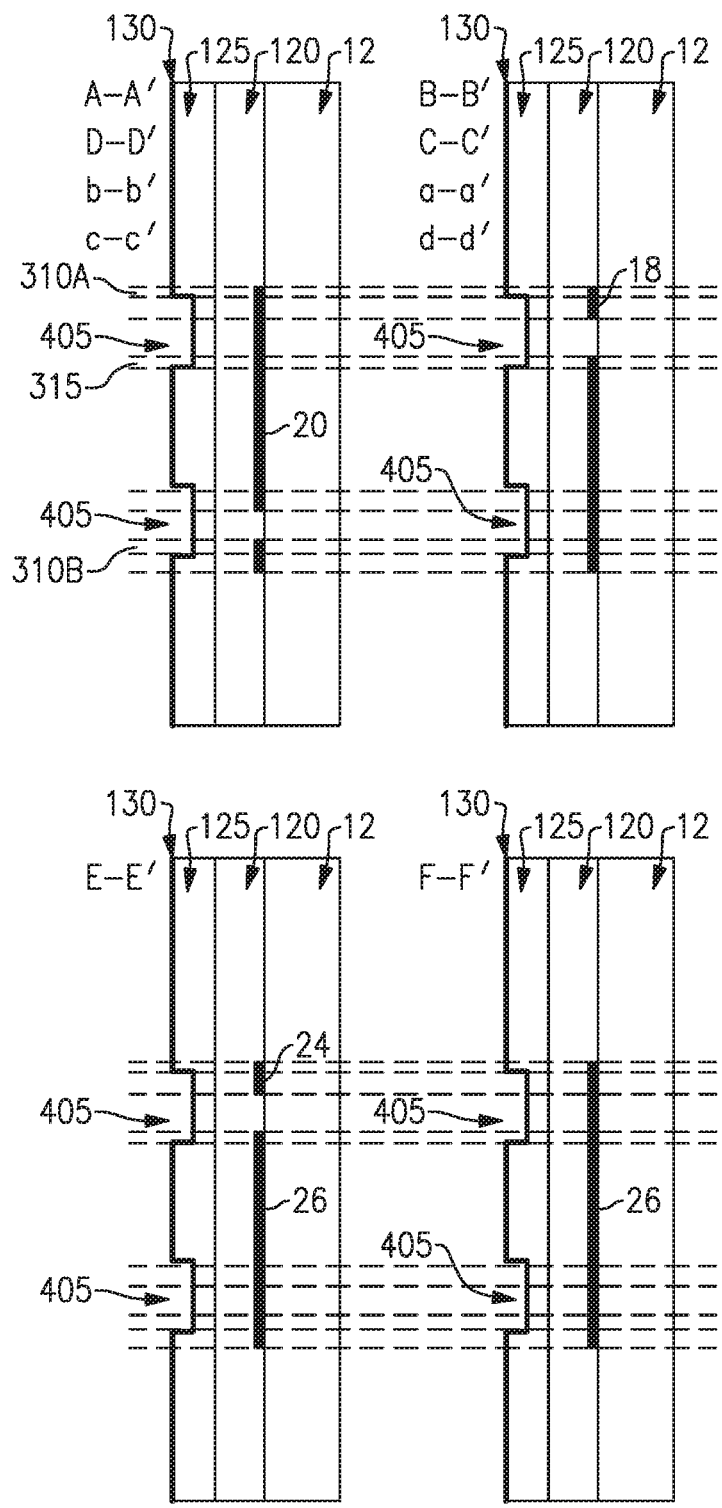
FIG. 5C illustrates cross-sections through different portions of the longitudinal mode coupled surface acoustic wave resonator of FIG. 5A.

An alternate longitudinal mode coupled resonator structure 500 is illustrated in plan and cross-sectional views through lines A-A', B-B', C-C', D-D', E-E', F-F', a-a', b-b', c-c', and d-d' in FIGS. 5A-5C. The alternative longitudinal mode coupled resonator may include five IDT electrode structures disposed between the reflectors as illustrated in FIG. 5A or seven IDT electrode structures disposed between the reflectors as illustrated in FIG. 5B. The number of IDT electrode structures included in a longitudinal mode coupled resonator as disclosed herein is not limited to a particular number and may be selected in accordance with design requirements. A difference between the longitudinal mode coupled resonator 300 and the longitudinal mode coupled resonator 500 is that in the longitudinal mode coupled resonator 500, all electrode fingers in the reflectors 316 do not have the same length. The reflectors 316 of the longitudinal mode coupled resonator 500 include a region 316A with electrode fingers that do not fully extend between the reflector busbars. The electrode fingers in region 316A of the reflectors 316 of longitudinal mode coupled resonator 500 may have the same lengths as the lengths of the IDT electrode fingers. Further, in longitudinal mode coupled resonator 500 the SiN trench regions 405 are continuous and extend across an entirety of the IDT electrode structures and reflectors and may extend partially beyond the outer edges of the reflectors 316. The SiN trenches 405 cover portions of the busbars, bases and tips of the IDT electrodes, and portions of the busbars and electrode fingers in the reflectors, including tips of the reduced length reflector electrode fingers in region 316A.

The numbers of electrodes, electrode pitch, and thicknesses of the various layers and regions of the longitudinal mode coupled resonator 500 may be the same as in the longitudinal mode coupled resonator 500 as illustrated in FIGS. 4A-4C except, as noted above, the SiN trench extends across the entire IDT electrode and reflector structures.

In the longitudinal mode coupled resonator 500 providing a sound velocity discontinuity about all the IDT electrode structures with the SiN trench structure may reduce the leakage of acoustic waves in the lengthwise extending direction of the IDT electrode fingers. Several electrode fingers of the reflectors adjacent to the IDT electrode structures are configured to be shortened and to not connect with both bus bars, similar to the IDT electrode fingers. This may also reduce the leakage of acoustic waves in the lengthwise extending direction of the reflector electrode fingers and may reduce the discontinuity between the IDT electrode structures and the reflectors and thus may reduce the bulk acoustic wave emissions.

EXAMPLES

Example 1

Figure 6:
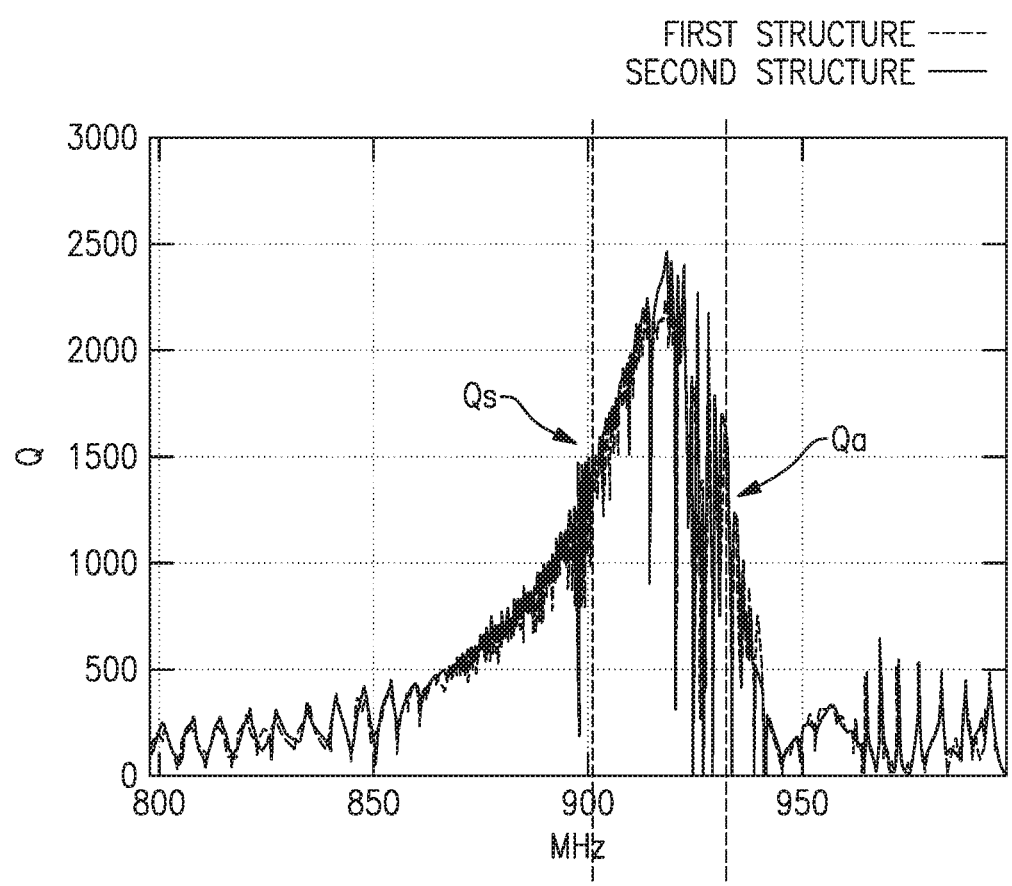
FIG. 6 is a chart comparing quality factor of a surface acoustic wave resonator as illustrated in FIG. 2A with quality factor of a surface acoustic wave resonator as illustrated in FIG. 3A.

A comparison between the electrical characteristics of a first single port resonator as illustrated in FIG. 2A and a second single port resonator as illustrated in FIG. 3A was performed. The results of the testing of these resonator structures include comparative plots of Q factor (FIG. 6) over a range of frequencies. The second structure exhibited an improved Q factor as compared to the Q factor of the first structure. At the resonance frequencies of the resonators, the first resonator structure showed a Q value of 985 while the second structure showed a Q value of 1143. At the anti-resonance frequencies of the resonators, the first resonator structure showed a Q value of 1380 while the second structure showed a Q value of 1534.

Example 2

Figure 7A:
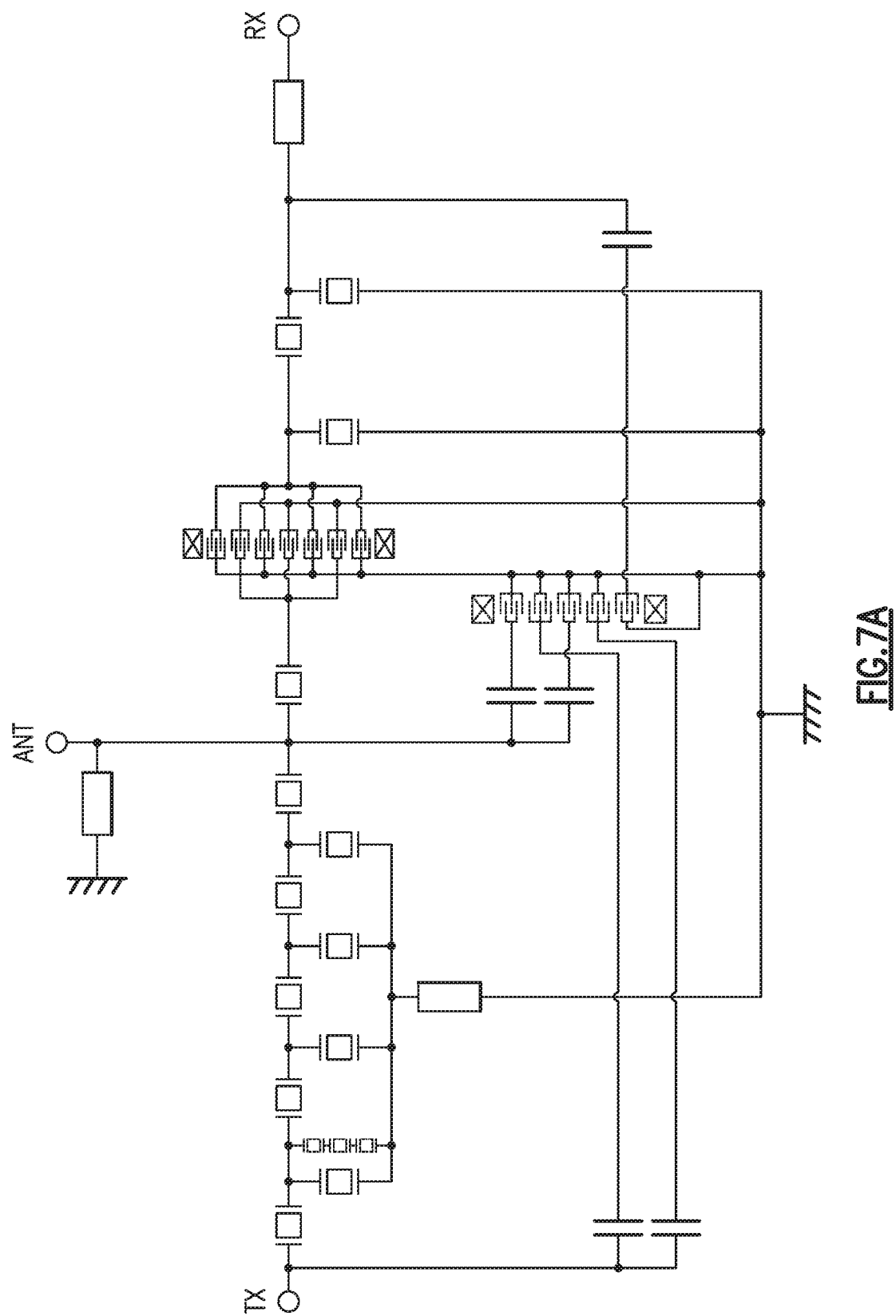
FIG. 7A is a circuit diagram of an example of a duplexer.

A duplexer having the circuit structure illustrated in FIG. 7A was constructed. The electrical characteristics of the duplexer with the colored resonators formed as a first single port resonator as illustrated in FIG. 2A or a first longitudinal mode coupled resonator as illustrated in FIG. 4A were compared to the electrical characteristics of the duplexer with the colored resonators formed as a second single port resonator as illustrated in FIG. 3A or a second longitudinal mode coupled resonator as illustrated in FIG. 5A.

Figure 7B:
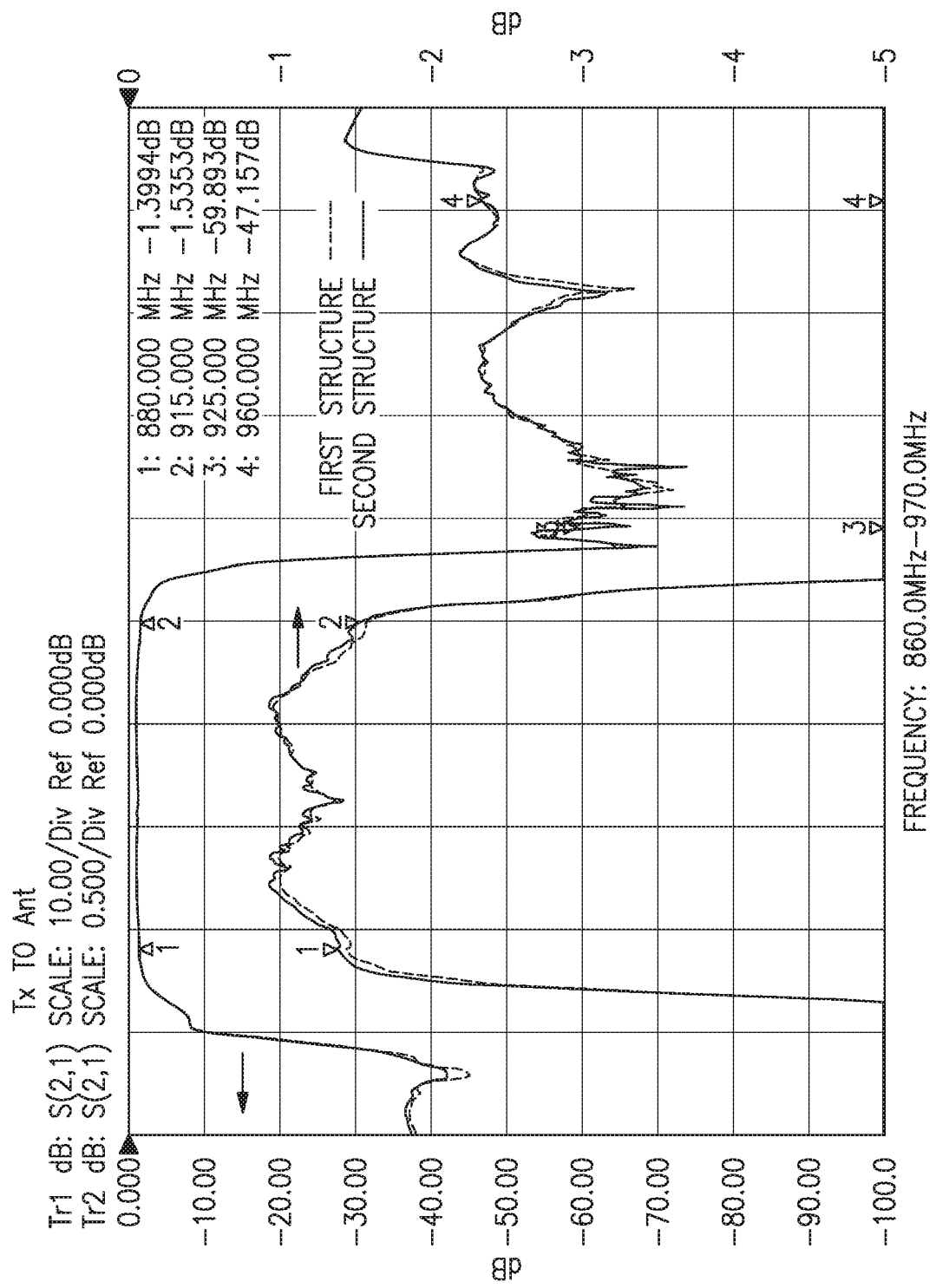
FIG. 7B is a chart comparing insertion loss of a transmit side filter of the duplexer of FIG. 7A with different resonator types as disclosed herein.

A comparison of the insertion loss of the transmit side filter of the duplexer using the second resonator structures versus the first is illustrated in the graph of FIG. 7B. A comparison of the insertion loss of the receive side filter of the duplexer using the second resonator structures versus the first is illustrated in the graph of FIG. 7C. In both cases, the duplexer including the second resonator structures exhibited an improved insertion loss of between about 0.059 and about 0.076 at the upper and lower portions of the filter pass bands as compared to the duplexer including the first resonator structures. The data for the insertion loss for these two duplexer structures in provided in the tables below:

TABLE 1

| Transmit side insertion loss comparison Insertion Loss (db) | | |
|---|---|---|
| | @880 MHz | @915 MHz |
| First structure | 1.460 | 1.597 |
| Second structure | 1.399 | 1.535 |
| Difference | −0.061 | −0.062 |

TABLE 2

| Receive side insertion loss comparison Insertion Loss (db) | | |
|---|---|---|
| | @925 MHz | @960 MHz |
| First structure | 1.616 | 1.586 |
| Second structure | 1.540 | 1.527 |
| Difference | −0.076 | −0.059 |

Figure 8:
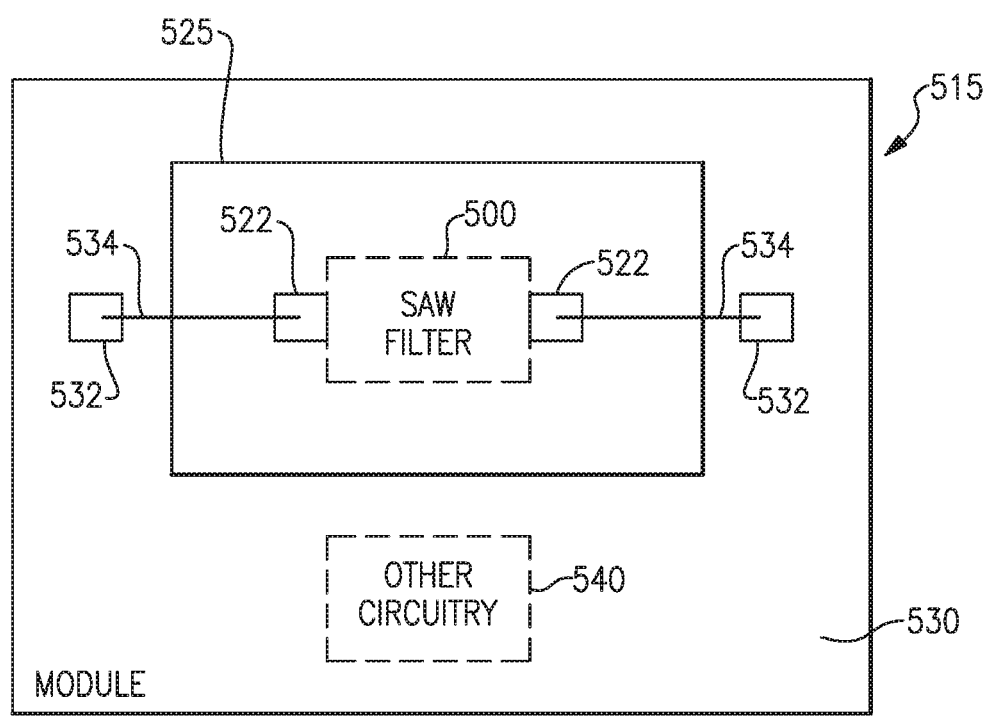
FIG. 8 is a block diagram of one example of a filter module that can include one or more acoustic wave elements according to aspects of the present disclosure.
Figure 9:
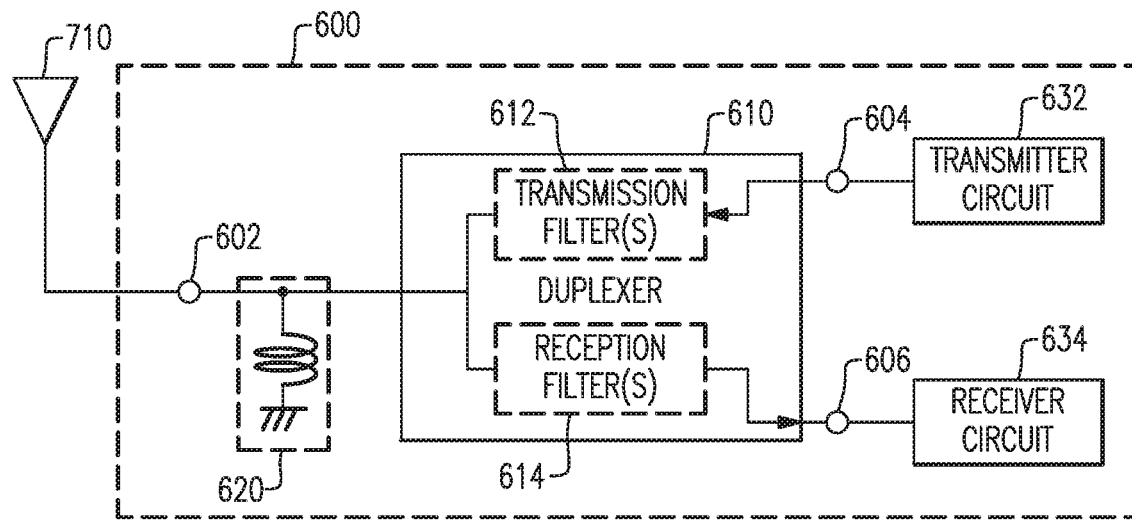
FIG. 9 is a block diagram of one example of a front-end module that can include one or more filter modules according to aspects of the present disclosure.
Figure 10:
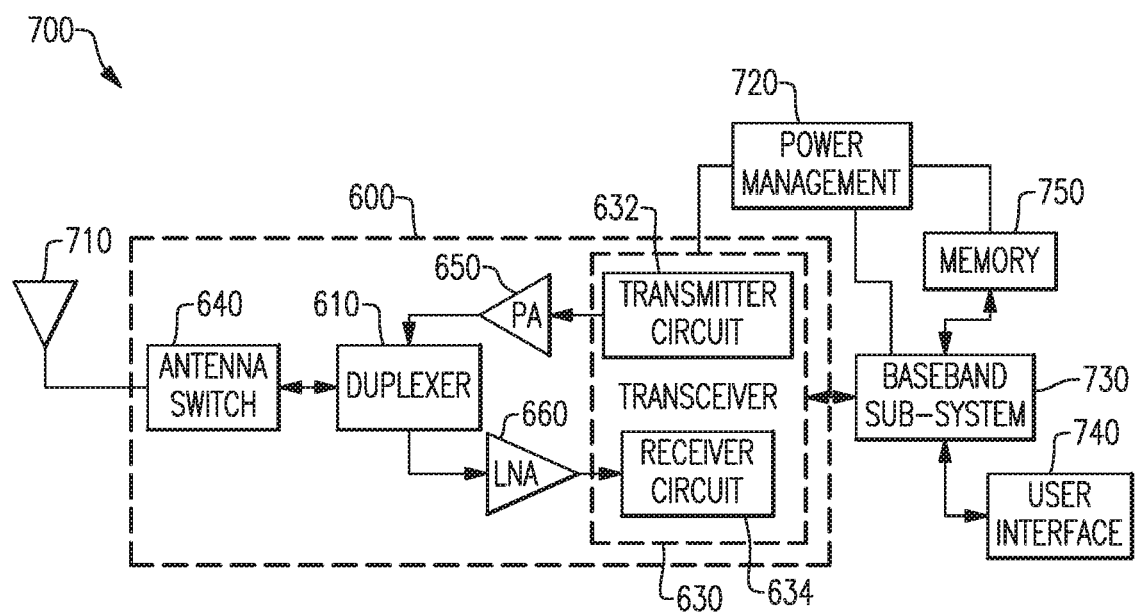
FIG. 10 is a block diagram of one example of a wireless device including the front-end module of FIG. 9.

Examples of the SAW resonators disclosed herein may operate at radio frequencies and can be implemented in a variety of packaged modules. Some example packaged modules will now be discussed in which any suitable principles and advantages of the RF resonators discussed herein can be implemented. FIGS. 8, 9, and 10 are schematic block diagrams of illustrative packaged modules and devices according to certain embodiments.

As discussed above, surface acoustic wave resonators can be used in surface acoustic wave (SAW) RF filters as disclosed herein. In turn, a SAW RF filter using one or more surface acoustic wave elements may be incorporated into and packaged as a module that may ultimately be used in an electronic device, such as a wireless communications device, for example. FIG. 8 is a block diagram illustrating one example of a module 515 including a SAW filter 500. The SAW filter 500 may be implemented on one or more die(s) 525 including one or more connection pads 522. For example, the SAW filter 500 may include a connection pad 522 that corresponds to an input contact for the SAW filter and another connection pad 522 that corresponds to an output contact for the SAW filter. The packaged module 515 includes a packaging substrate 530 that is configured to receive a plurality of components, including the die 525. A plurality of connection pads 532 can be disposed on the packaging substrate 530, and the various connection pads 522 of the SAW filter die 525 can be connected to the connection pads 532 on the packaging substrate 530 via electrical connectors 534, which can be solder bumps or wirebonds, for example, to allow for passing of various signals to and from the SAW filter 500. The module 515 may optionally further include other circuitry die 540, for example, one or more additional filter(s), amplifiers, pre-filters, modulators, demodulators, down converters, and the like, as would be known to one of skill in the art of semiconductor fabrication in view of the disclosure herein. In some embodiments, the module 515 can also include one or more packaging structures to, for example, provide protection and facilitate easier handling of the module 515. Such a packaging structure can include an overmold formed over the packaging substrate 530 and dimensioned to substantially encapsulate the various circuits and components thereon.

Various examples and embodiments of the SAW filter 500 can be used in a wide variety of electronic devices. For example, the SAW filter 500 can be used in an antenna duplexer, which itself can be incorporated into a variety of electronic devices, such as RF front-end modules and communication devices.

Referring to FIG. 9, there is illustrated a block diagram of one example of a front-end module 600, which may be used in an electronic device such as a wireless communications device (e.g., a mobile phone) for example. The front-end module 600 includes an antenna duplexer 610 having a common node 602, an input node 604, and an output node 606. An antenna 710 is connected to the common node 602.

The antenna duplexer 610 may include one or more transmission filters 612 connected between the input node 604 and the common node 602, and one or more reception filters 614 connected between the common node 602 and the output node 606. The passband(s) of the transmission filter(s) are different from the passband(s) of the reception filters. Examples of the SAW filter 500 can be used to form the transmission filter(s) 612 and/or the reception filter(s) 614. An inductor or other matching component 620 may be connected at the common node 602.

The front-end module 600 further includes a transmitter circuit 632 connected to the input node 604 of the duplexer 610 and a receiver circuit 634 connected to the output node 606 of the duplexer 610. The transmitter circuit 632 can generate signals for transmission via the antenna 510, and the receiver circuit 634 can receive and process signals received via the antenna 510. In some embodiments, the receiver and transmitter circuits are implemented as separate components, as shown in FIG. 9, however, in other embodiments these components may be integrated into a common transceiver circuit or module. As will be appreciated by those skilled in the art, the front-end module 600 may include other components that are not illustrated in FIG. 9 including, but not limited to, switches, electromagnetic couplers, amplifiers, processors, and the like.

FIG. 10 is a block diagram of one example of a wireless device 700 including the antenna duplexer 610 shown in FIG. 9. The wireless device 700 can be a cellular phone, smart phone, tablet, modem, communication network or any other portable or non-portable device configured for voice or data communication. The wireless device 700 can receive and transmit signals from the antenna 710. The wireless device includes an embodiment of a front-end module 600 similar to that discussed above with reference to FIG. 9. The front-end module 600 includes the duplexer 610, as discussed above. In the example shown in FIG. 10 the front-end module 600 further includes an antenna switch 640, which can be configured to switch between different frequency bands or modes, such as transmit and receive modes, for example. In the example illustrated in FIG. 10, the antenna switch 640 is positioned between the duplexer 610 and the antenna 710; however, in other examples the duplexer 610 can be positioned between the antenna switch 640 and the antenna 710. In other examples the antenna switch 640 and the duplexer 610 can be integrated into a single component.

The front-end module 600 includes a transceiver 630 that is configured to generate signals for transmission or to process received signals. The transceiver 630 can include the transmitter circuit 632, which can be connected to the input node 604 of the duplexer 610, and the receiver circuit 634, which can be connected to the output node 606 of the duplexer 610, as shown in the example of FIG. 9.

Signals generated for transmission by the transmitter circuit 632 are received by a power amplifier (PA) module 650, which amplifies the generated signals from the transceiver 630. The power amplifier module 650 can include one or more power amplifiers. The power amplifier module 650 can be used to amplify a wide variety of RF or other frequency-band transmission signals. For example, the power amplifier module 650 can receive an enable signal that can be used to pulse the output of the power amplifier to aid in transmitting a wireless local area network (WLAN) signal or any other suitable pulsed signal. The power amplifier module 650 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 650 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 10, the front-end module 600 may further include a low noise amplifier module 660, which amplifies received signals from the antenna 510 and provides the amplified signals to the receiver circuit 634 of the transceiver 630.

The wireless device 700 of FIG. 10 further includes a power management sub-system 720 that is connected to the transceiver 630 and manages the power for the operation of the wireless device 700. The power management system 720 can also control the operation of a baseband sub-system 730 and various other components of the wireless device 700. The power management system 720 can include, or can be connected to, a battery (not shown) that supplies power for the various components of the wireless device 700. The power management system 720 can further include one or more processors or controllers that can control the transmission of signals, for example. In one embodiment, the baseband sub-system 730 is connected to a user interface 740 to facilitate various input and output of voice and/or data provided to and received from the user. The baseband sub-system 730 can also be connected to memory 750 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave (SAW) resonator comprising:
   at least one set of interdigital transducer (IDT) electrodes disposed on an upper surface of a piezoelectric substrate between first and second reflector gratings;
   a layer of silicon nitride disposed over the at least one set of IDT electrodes and the first and second reflector gratings; and
   a continuous trench formed in the layer of silicon nitride over portions of bus bar electrodes and tips of electrode fingers of the at least one set of IDT electrodes and over portions of bus bar electrodes and electrode fingers of the first and second reflector gratings to reduce acoustic leakage at electrode fingers of the first and second reflector gratings proximate the at least one set of IDT electrodes.

2. The SAW resonator of claim 1 wherein the first and second reflector gratings each include reduced length electrode fingers with lengths less than a length between the bus bar electrodes of the first and second reflector gratings and full-length electrode fingers extending between the bus bar electrodes of the first and second reflector gratings.

3. The SAW resonator of claim 2 wherein the reduced length electrode fingers are positioned on sides of the first and second reflector gratings closest to the at least one set of IDT electrodes.

4. The SAW resonator of claim 3 wherein the reduced length electrode fingers closest to the at least one set of IDT electrodes include tip portions spaced from one of the bus bar electrodes of the first and second reflector gratings on an opposite side of the resonator than tip portions of outermost electrode fingers of the at least one set of IDT electrodes.

5. The SAW resonator of claim 2 wherein the reduced length electrode fingers include about 25% of a total number of electrode fingers in the reflector gratings.

6. The SAW resonator of claim 1 further comprising a layer of silicon oxynitride disposed on an upper surface of the layer of silicon nitride.

7. The SAW resonator of claim 1 configured as a single port resonator.

8. The SAW resonator of claim 1 configured as a longitudinal mode coupled resonator.

9. The SAW resonator of claim 8 wherein each set of IDT electrodes includes electrodes with varying pitches.

10. The SAW resonator of claim 8 wherein each of the reflector gratings includes electrodes with varying pitches.

11. The SAW resonator of claim 1 wherein no electrode fingers in the at least one set of IDT electrodes are apodized.

12. The SAW resonator of claim 1 wherein the trench extends beyond outer sides of the first and second reflector gratings on opposite sides of the first and second reflector gratings from the at least one set of IDT electrodes.

13. An electronic device with an electronics module having at least one radio frequency filter including at least one surface acoustic wave (SAW) resonator comprising:
    at least one set of interdigital transducer (IDT) electrodes disposed on an upper surface of a piezoelectric substrate between first and second reflector gratings;
    a layer of silicon nitride disposed over the at least one set of IDT electrodes and first and second reflector gratings; and
    a continuous trench formed in the layer of silicon nitride over portions of bus bar electrodes and tips of electrode fingers of the at least one set of IDT electrodes and over portions of bus bar electrodes and electrode fingers of the first and second reflector gratings to reduce acoustic leakage at electrode fingers of the first and second reflector gratings proximate the at least one set of IDT electrodes.

14. A surface acoustic wave (SAW) resonator comprising:
at least one set of interdigital transducer (IDT) electrodes disposed on an upper surface of a piezoelectric substrate between first and second reflector gratings, the first and second reflector gratings each including reduced length electrode fingers with lengths less than a length between bus bar electrodes of the first and second reflector gratings;
a layer of silicon nitride disposed over the at least one set of IDT electrodes and first and second reflector gratings; and
a trench formed in the layer of silicon nitride over portions of bus bar electrodes and tips of electrode fingers of the at least one set of IDT electrodes and over portions of the bus bar electrodes and electrode fingers of the first and second reflector gratings to reduce acoustic leakage at electrode fingers of the first and second reflector gratings proximate the at least one set of IDT electrodes.

15. The SAW resonator of claim 14 wherein the reduced length electrode fingers are positioned on sides of the first and second reflector gratings closest to the at least one set of IDT electrodes.

* * * * *

UNITED STATES PATENT AND TRADEMARK OFFICE
CERTIFICATE OF CORRECTION

PATENT NO. : 11,239,817 B2  
APPLICATION NO. : 16/918050  
DATED : February 1, 2022  
INVENTOR(S) : Hatano Page 1 of 1

It is certified that error appears in the above-identified patent and that said Letters Patent is hereby corrected as shown below:

On the Title Page

Item (72) Inventor: delete "Koichi Hatano, Yokohama (JP)" and insert -- Koichi Hatano, Yokohama-Shi (JP) --

Signed and Sealed this  
Eighth Day of March, 2022

Drew Hirshfeld  
*Performing the Functions and Duties of the*  
*Under Secretary of Commerce for Intellectual Property and*  
*Director of the United States Patent and Trademark Office*